(12) United States Patent
Itatani et al.

(10) Patent No.: US 6,890,626 B1
(45) Date of Patent: May 10, 2005

(54) IMIDE-BENZOXAZOLE POLYCONDENSATE AND PROCESS FOR PRODUCING THE SAME

(75) Inventors: Hiroshi Itatani, Yokohama (JP); Shunichi Matsumoto, Kamakura (JP)

(73) Assignee: PI R&D Co., Ltd., Kanagawa (JP)

( * ) Notice: Subject to any disclaimer, the term of this patent is extended or adjusted under 35 U.S.C. 154(b) by 0 days.

(21) Appl. No.: 10/129,844

(22) PCT Filed: Nov. 8, 2000

(86) PCT No.: PCT/JP00/07840

§ 371 (c)(1),
(2), (4) Date: Sep. 23, 2002

(87) PCT Pub. No.: WO01/34679

PCT Pub. Date: May 17, 2001

(30) Foreign Application Priority Data

Nov. 10, 1999 (JP) ............................................ 11/356373

(51) Int. Cl.$^7$ ........................... B32B 15/08; C08G 73/00
(52) U.S. Cl. ..................... 428/195.1; 428/209; 428/458; 427/96.1; 427/98.4; 430/270.1; 430/311; 430/319; 430/325; 430/406; 528/176; 528/179; 528/183; 528/188; 528/210
(58) Field of Search ............................... 430/270.1, 311, 430/319, 325, 406; 528/176, 179, 183, 188, 210; 427/96.1, 98.4, 96; 428/195.1, 209, 458

(56) References Cited

U.S. PATENT DOCUMENTS 4,087,409 A  5/1978  Preston ....................... 528/229
5,919,892 A  7/1999  Hwang et al. .............. 528/220

FOREIGN PATENT DOCUMENTS

| EP | 0387062 A2 | 9/1990 |
| JP | 5-67871 A | 3/1993 |
| JP | 8-12763 A | 1/1996 |
| JP | 8-176301 A | 7/1996 |
| JP | 11236450 | 8/1999 |
| JP | 2000-147768 A | 5/2000 |
| JP | 2001-11181 A | 1/2001 |

*Primary Examiner*—Monique R. Jackson
(74) *Attorney, Agent, or Firm*—Birch, Stewart, Kolasch & Birch, LLP

(57) ABSTRACT

A polyimide-based polycondensate which may be used as an insulation film by coating a copper foil with the polycondensate and by heating the coated copper foil, which insulation film does not warp the foil, as well as a production process thereof, is disclosed. The polycondensate according to the invention is a solvent-soluble polycondensate containing a benzoxazole component having a carboxylic group and an imide component having a phenolic hydroxyl group, which is obtained by dehydration-condensing one or more tetracarboxylic dianhydrides with one or more aromatic diamines having an amino group and a phenolic hydroxyl group, the amino group and the phenolic hydroxyl group being located at ortho positions with respect to each other, by heating the one or more tetracarboxylic dianhydrides and the one or more aromatic diamines at 150° C. to 220° C. in the presence of an acid catalyst.

17 Claims, 7 Drawing Sheets

IMIDE-BENZOXAZOLE POLYCONDENSATE AND PROCESS FOR PRODUCING THE SAME

This application is the national phase under 35 U.S.C. § 371 of PCT International Application No. PCT/JP00/07840 which has an International filing date of Nov. 8, 2000, which designated the United States of America.

TECHNICAL FIELD

The present invention relates to an imide-benzoxazole-based polycondensate and process for producing the same. The polycondensate according to the present invention may suitably be used as an insulation film which does not warp the foil, by coating a copper foil with the polycondensate and heating the coated copper foil.

BACKGROUND ART

Polyimides are excellent in heat resistance, electric insulation performance, mechanical properties, chemical resistance and the like, so that they are widely used in electric and electronic parts, airplane parts, car parts, peripheral circuits of semiconductors and the like, with the compaction and precision of these.

Since conventional polyimides represented by Kapton are insoluble in solvents, the methods are widely employed, in which aromatic tetracarboxylic dianhydrides and aromatic diamines are polycondensed in polar solvents at a temperature not higher than 10° C. to obtain polyamic acids that are precursors of polyimides, the obtained polyamic acids are applied to substrates and then heated at 250° C. to 350° C. to imidize the polyamic acids to polyimides.

Flexible printed boards made of a polyimide are subjected to a number of steps accompanying heat treatments at high temperatures, so that dimensional change occurs, which is problematic to processing of the boards. Thus, a material for forming a composite board for use as a flexible printed board or a film for TAB, which is prepared by coating copper foil with a polyimide to form a multi-layered board, and which is free from warping, is demanded.

To obtain a composite material free from warping or curling, it has been tried to make the coefficients of linear expansion of the copper foil and of the film material close.

As an example, it has been found that a flexible printed board with good adhesion and reduced warping may be obtained by employing a solvent-soluble polyimide and treating the polyimide film-coated substrate at a low temperature (Japanese Laid-open Patent Application (Kokai) No. 10-224017). A method in which a polyimide having ether imide group is employed (Japanese Laid-open Patent Application (Kokai) No. 8-217877), and a method in which a polyimide composition in which the polyimide components are variously changed (Japanese Laid-open Patent Application (Kokai) Nos. 741556 and 60-243120) have been tried.

On the other hand, polyimides are also applied to circuit boards or the like as photosensitive resins. They are used as negative-type photoresists by converting the polyamic acid to acrylic acid ester thereof, irradiating the resultant with light after adding a radical generator, thereby curing the irradiated portions, and dissolving the non-irradiated portions in an alkaline developer to form negative-type images. Since positive-type photoresists are more sensitive and give higher resolutions than the negative-type photoresists, a positive-type photoresist is demanded for forming patterns of through holes.

Novolak resins have phenolic hydroxyl groups, and upon being irradiated with light together with a photoacid generator, they come to be soluble in alkaline developers, so that they are widely used as positive-type photoresists. Polyimides having phenolic hydroxyl groups have been prepared, and it has been confirmed that upon irradiating such a polyimide together with a photoacid generator, they come to be soluble in alkaline developers so as to form positive-type images (Japanese Laid-open Patent Application (Kokai) No. 64-60630, U.S. Pat. No. 4,927,736, Japanese Laid-open Patent Application (Kokai) Nos. 3-209478 and 4-110348). It has been shown that polyimide having no phenolic hydroxyl groups do not form positive-type images (Japanese Laid-open Patent Application (Kokai) No. 3-209478).

Even the polyimides having no phenolic hydroxyl groups, by irradiating the polyimides with light together with a photoacid generator and by developing the resultant with an amino alcohol-containing developer, imide bonds are cleaved so that high molecular polyimides are made into low molecular polyimides and dissolved in the developer, so as to form positive-type images (PCT/JP98/04577).

DISCLOSURE OF THE INVENTION

An object of the present invention is to provide a novel imide-benzoxazole-based polycondensate which may give a flexible circuit board free from deformation such as curling and twisting, by coating a copper foil with the polycondensate and heating it to make a coating film, and which may give photosensitivity by adding a photoacid generator, as well as a production process thereof.

The present inventors intensively studied to discover that a polycondensate containing an imide component having a phenolic hydroxyl group and a benzoxazole component having a carboxyl group as constituting units is obtained by polycondensing one or more tetracarboxylic dianhydrides with one or more aromatic diamines having an amino group and a phenolic hydroxyl group under prescribed conditions, the amino group and the phenolic hydroxyl group in the diamine being located at ortho positions with respect to each other, and the polycondensate attains the above-mentioned object of the present invention, thereby completing the present invention.

That is, the present invention provides a process for producing a solvent-soluble polycondensate containing a benzoxazole component having a carboxylic group and an imide component having a phenolic hydroxyl group, which process comprising dehydration-condensing one or more tetracarboxylic dianhydrides with one or more aromatic diamines having an amino group and a phenolic hydroxyl group, said amino group and said phenolic hydroxyl group being located at ortho positions with respect to each other, by heating said one or more tetracarboxylic dianhydrides and said one or more aromatic diamines at 150° C. to 220° C. in the presence of an acid catalyst. The present invention further provides a composite copper substrate obtainable by coating a copper foil with the polycondensate according to the present invention and heating the resultant at 150° C. to 250° C. The present invention still further provides a method for forming a positive-type image comprising coating a substrate with a photosensitive polycondensate composition containing the polycondensate according to the present invention and a photoacid generator; irradiating the composition with a light through a mask pattern; and developing the resulting composition with an alkaline developer. The present invention still further provides a circuit board produced by subjecting a copper foil to the above-described method for forming positive-type images. The present invention still further provides a method comprising heating the polycondensate according to the present invention at 300° C. to 350° C. so as to convert it to polyimide.

By the present invention, a novel imide-benzoxazole-based polycondensate which may give a flexible circuit board free from deformation such as curling and twisting, by coating a copper foil with the polycondensate and heating it to make a coating film, and which may give photosensitivity by adding a photoacid generator, as well as a production process thereof, is provided.

BEST MODE FOR CARRYING OUT THE INVENTION

Figure 1:
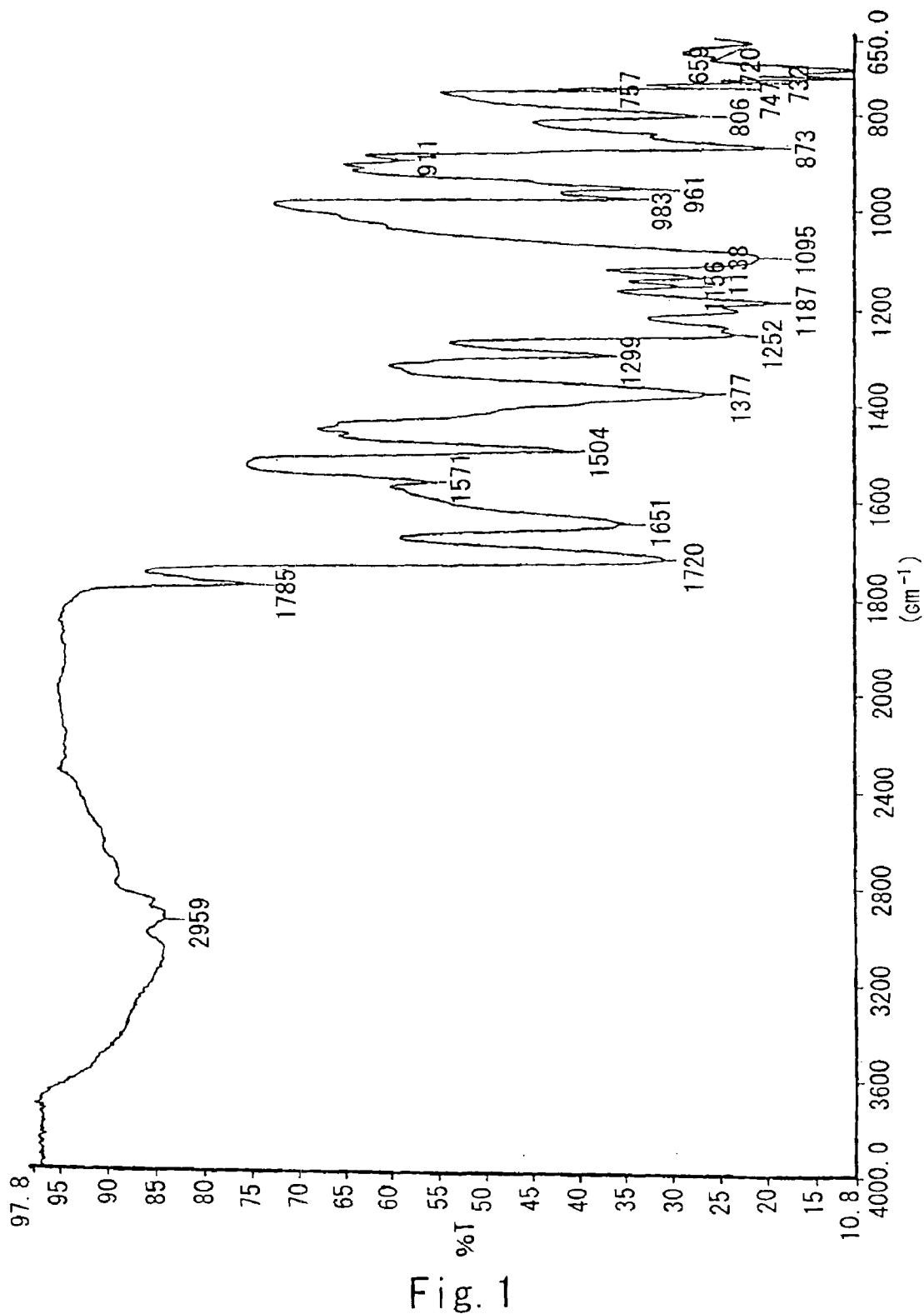
FIG. 1 is a graph showing the results of measurements of infrared absorption spectrum of the polycondensate prepared in Example 1.

As mentioned above, in the method of the present invention, one or more tetracarboxylic dianhydrides are dehydration-condensed with one or more aromatic diamines having an amino group and a phenolic hydroxyl group, the amino group and the phenolic hydroxyl group being located at ortho positions with respect to each other, by heating the one or more tetracarboxylic dianhydrides and the one or more aromatic diamines at 150° C. to 220° C. in the presence of an acid catalyst.

The tetracarboxylic dianhydride used in the method of the present invention is not restricted and aromatic tetracarboxylic dianhydrides are preferred. Preferred examples include 3,4,3',4'-biphenyltetracarboxylic dianhydride, 2,3,3',4'-biphenyltetracarboxylic dianhydride, 3,4,3',4'-benzophenonetetracarboxylic dianhydride, bicyclo(2,2,2)-oct-7-ene-2,3,5,6-tetracarboxylic dianhydride, 2,2-bis(3,4-dicarboxyphenyl)propane dianhydride, bis(3,4-dicarboxyphenyl)sulfone dianhydride, bis(3,4-dicarboxyphenyl)ether dianhydride and 2,2-bis(3,4-dicarboxyphenyl)hexafluoropropane dianhydride, but the tetracarboxylic dianhydride is not restricted to these examples. These tetracarboxylic dianhydrides may be employed individually or in combination.

The diamine used in the method of the present invention is an aromatic diamine having an amino group and a phenolic hydroxyl group which are located at ortho position with respect to each other. That is, the aromatic diamine used here is one having, on an aromatic ring, preferably benzene ring, a hydroxyl group (i.e., phenolic hydroxyl group) and an amino group located at ortho position of the phenolic hydroxyl group, and another amino group located at a different position. As long as these requirements are met, the diamine is not restricted. Preferred examples of the aromatic diamine having an amino group and a phenolic hydroxyl group, which are located at ortho positions with respect to each other, include 1-hydroxy-2,4-diaminobenzene, 1-hydroxy-2,5-diaminobenzene, 3,3'-dihydroxybenzidine, 3,3'-dihydroxy-4,4'-diaminodiphenyl ether, 1,4-bis(3-hydroxy-4-aminophenoxy)benzene, 2,2-bis(4-amino-3-hydroxyphenyl)propane, bis(3-amino-4-hydroxyphenyl) propane, bis(3-amino-4-hydroxyphenyl)sulfide and 2,2-bis (3-amino-4-hydroxyphyenyl)hexafluoropropane, but the aromatic diamine is not restricted to these examples. These aromatic diamines may be employed individually or in combination.

The dehydration condensation reaction is carried out by heating the above-mentioned tetracarboxylic dianhydride(s) and the aromatic diamine(s) at 150° C. to 220° C., preferably 170° C. to 200° C., in the presence of an acid catalyst. If the reaction temperature is lower than 150° C., the dehydration condensation does not well proceed, and if it is higher than 220° C., benzoxazole component is not well formed.

As the acid catalyst, although inorganic acids such as sulfuric acid and organic acids such as p-toluenesulfonic acid, which are usually used for the production of polyimides, may be employed, these acid catalysts remain in the polymer solution after completion of the reaction, thereby causing degradation of the quality of the polymer product. Therefore, it is necessary to remove these catalysts from the polymer product by precipitating and re-dissolving the polymer. Thus, in the method of the present invention, it is preferred to employ an acid generated in situ by carrying out the above-described dehydration condensation in the presence of a lactone-base catalyst. That is, it is preferred to employ the catalytic system utilizing the following equilibrium reaction between a lactone, base and water.

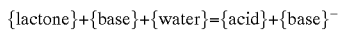

Dehydration condensation may be carried out using the {acid}$^+${base}$^-$ as a catalyst. The produced water is eliminated from the reaction system by azeotropic distillation with toluene. When the imidation in the reaction system is completed, {acid}$^+${base}$^-$ is converted to the lactone and the base, and they lose the catalytic activity and are removed from the reaction system with the toluene. The polyimide solution produced by this process can be industrially used as it is as a polyimide solution with high purity because the above-mentioned catalytic substances are not contained in the polyimide solution after the reaction.

As the lactone used here, γ-valerolactone is preferred. As the base, pyridine and/or methylmorpholine is(are) preferred.

Preferred reaction solvents used for the dehydration condensation reaction include, in addition to the above-mentioned toluene, organic polar solvents. Examples of such a polar solvent include N-methylpyrrolidone, dimethylformamide, dimethylacetamide, tetramethylurea and sulfolane. In view of environmental protection, N-methylpyrrolidone and sulfolane are preferred.

In cases where the above-mentioned lactone-base composite catalyst is used, the concentration of the acid dianhydride(s) at the beginning of the reaction based on the total reaction mixture may preferably be about 4 to 16% by weight, the concentration of the lactone may preferably be about 0.2 to 0.6% by weight, the concentration of the base may preferably be about 0.3 to 0.9% by weight and the concentration of toluene may preferably be about 6 to 15% by weight. The amount of the aromatic diamine(s) may preferably be 0.95 to 1.05 times (by mole) of the tetracarboxylic dianhydride(s) (production of a copolymer will be described later).

By the method of the present invention, a solvent-soluble polycondensate containing a benzoxazole component having a carboxylic group and imide component having a phenolic hydroxyl group (since the polycondensate contains an imide component and benzoxazole component as mentioned above, the polycondensate according to the present invention may be referred to as "PI-BO polymer" (polyimide-benzoxazole polymer) for convenience in the present specification). The term "benzoxazole component having a carboxylic group" herein means a constituent unit containing a benzoxazole moiety and a carboxylic group in one constituent unit (recurring unit) in the polycondensate. The carboxylic group does not necessarily exist on the benzoxazole structure. The term "imide component having a phenolic hydroxyl group" means a constituent unit containing an imide moiety and a phenolic hydroxyl group in one constituent unit (recurring unit). The structures of the benzoxazole component and of the imide component are defined by the structures of the above-described tetracarboxylic dianhydride and of the above-described aromatic diamine used as the reactants. The term "solvent-soluble" means that the polyimide is dissolved in N-methyl-2-pyrrolidone (NMP) to a concentration of not less than 5% by weight, preferably not less than 10% by weight.

The route through which the benzoxazole component having a carboxyl group and the imide component having a phenolic hydroxyl group are generated is shown in Chart 1. In Chart 1 (and in other charts and formulae), only the structures necessary for understanding how the benzoxazole component and the imide component are generated are described, and all of the other structures and substituents are schematically and collectively represented by a straight line crossing the benzene ring. For example, in Chart 1, although the tetracarboxylic dianhydride used as a reactant is shown to have only one carboxylic dianhydride, another carboxylic dianhydride (and also other additional substituents when it has such additional substituents) is schematically represented by the straight line crossing the benzene ring. Similarly, the aromatic diamine used as a reactant is shown to have only one amino group, another amino group (and also other additional substituents when it has such additional substituents) is schematically represented by the straight line crossing the benzene ring. Further, in Chart 1, the benzoxazole component having a carboxyl group is indicated as simply "benzoxazole", and the imide component having a phenolic hydroxyl group is indicated as simply "imide". Further, the acid catalyst and the amic acid are indicated as "acid catalyst" and "amic acid" in English, respectively.

CHART1

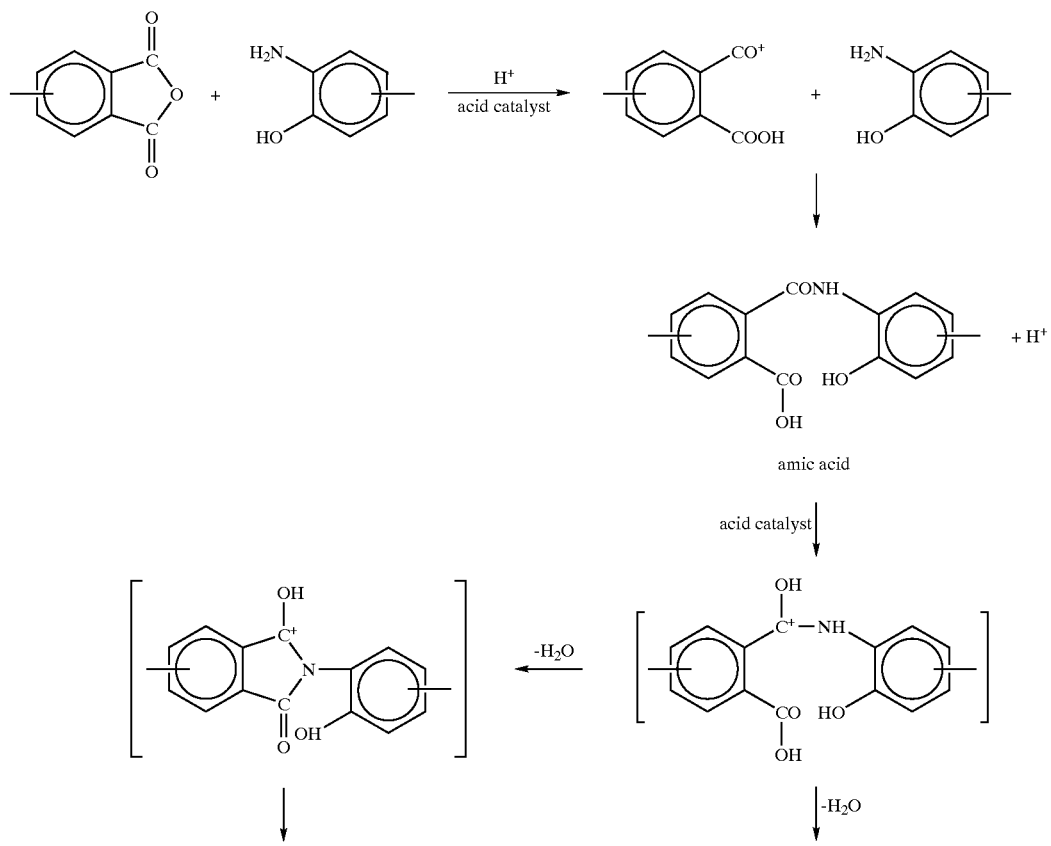

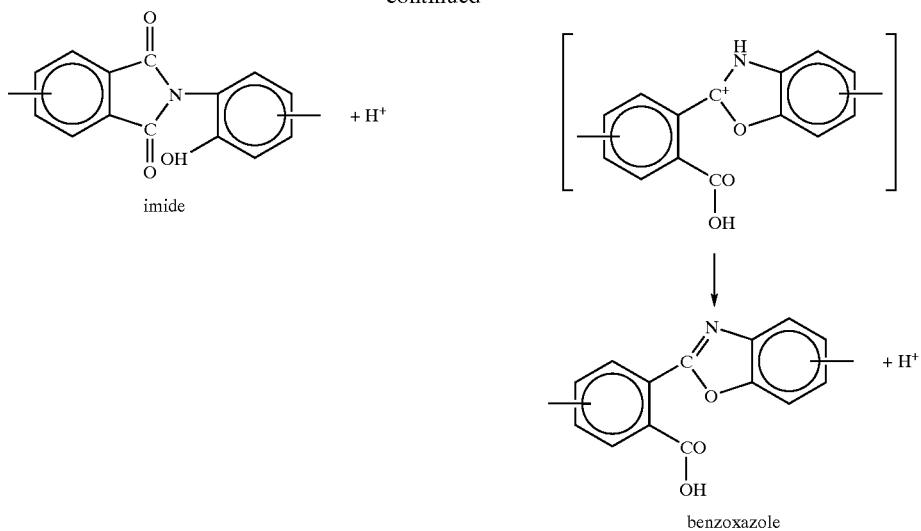

imide

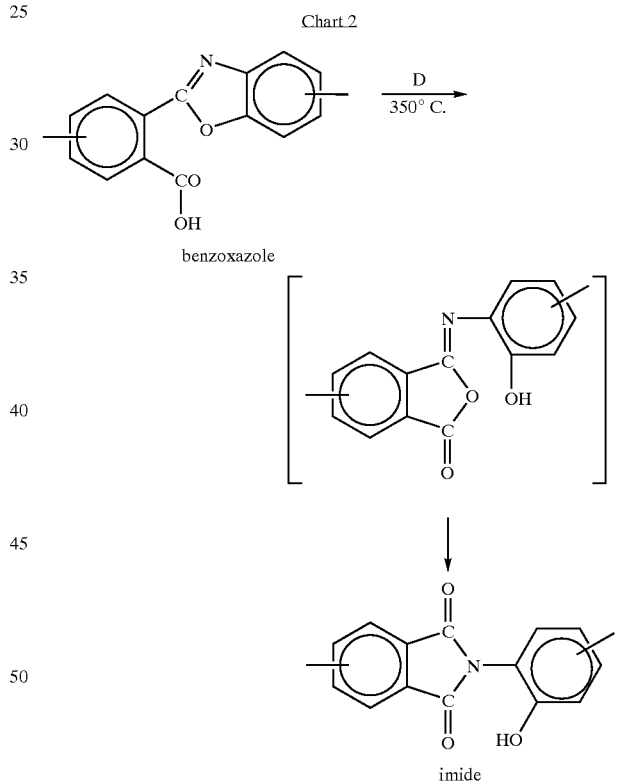

benzoxazole

As shown in Chart 1, when the intermediate formed by the reaction between the amic acid and the acid is dehydrated, the intermediate is divided into one which becomes the imide component having a phenolic hydroxyl group and one which becomes the benzoxazole having a carboxylic group.

The ratio of the formed benzoxazole component to the formed imide component varies depending on the types of the reactants, reaction temperature and reaction time. The higher the reaction temperature, the higher the ratio of the imide component, and the longer the reaction time, the higher the ratio of the imide component. Thus, the desired ratio may easily be attained by adjusting the reaction temperature and the reaction time.

In view of not warping the copper foil when the copper foil is coated with the polycondensate, the content of the benzoxazole component in the polycondensate may preferably be 13 to 60 mol %, more preferably 20 to 50 mol %. The reaction conditions for obtaining such a desired content of the benzoxazole component may easily be selected by routine experiments employing varying reaction temperature and reaction time, and a number of examples are described below. The content ratio of the benzoxazole component to the imide component may easily be determined based on the ratio of the absorption of C=N bond near 1650 cm$^{-1}$ to the absorption of imide bond near 1775 cm$^{-1}$ which ratio is obtained by measuring infrared absorption spectrum by a conventional method. The content of the benzoxazole component may also be adjusted by further employing an aromatic diamine for imidation which will be described below.

Thus, preferred reaction time varies depending on the reaction temperature and the types of reactants, and may appropriately be selected. Usually, the reaction time of about 30 minutes to 180 minutes is preferred in most cases.

Upon heating the polycondensate comprising the benzoxazole component and the imide component at 350° C., the entire benzoxazole component is converted to the imide component having a phenolic hydroxyl group as shown in Chart 2 below, and the polycondensate becomes a polyimide.

In the method of the present invention, employment of an aromatic diamine which does not have an amino group and a phenolic hydroxyl group which are located at ortho positions with respect to each other, in addition to the above-described aromatic diamine having an amino group and a phenolic hydroxyl group which are located at ortho positions with respect to each other, is preferred because the physical properties of the PI-BO polymer may be freely controlled. Since such an aromatic diamine does not yield the benzoxazole component but yields an imide component (but the imide component formed is not restricted to the above-mentioned imide component having a phenolic hydroxyl group), such an aromatic diamine is referred to as "aromatic diamine for imidation" for convenience in the specification and claims.

The aromatic diamine for imidation is not restricted at all and any aromatic diamine may be employed as long as it does not substantially adversely affect the effects of the present invention. Preferred examples of the aromatic diamine for imidation include aromatic diamines such as 4,4'-(or 3,4'-, 3,3'- or 2,4'-)diaminodiphenyl ether, 4,4'-(or 3,3'-)diaminodiphenylsulfone, 4,4'-(or 3,3'-) diaminodiphenyl sulfide, 4,4'-benzophenonediamine, 3,3'-benzophenonediamine, 4,4'-di(4-aminophenoxy) phenylsulfone, 4,4'-di(3-aminophenoxy)phenylsulfone, 4,4'-bis(4-aminophenoxy)biphenyl, 1,4-bis(4-aminophenoxy) benzene, 1,3-bis(3-aminophenoxy)benzene, 2,2-bis{4-(4-aminophenoxy)phenyl}propane, 3,3',5,5'-tetramethyl-4,4'-diaminodiphenylmethane, 4,4'-di(3-aminophenoxy) phenylsulfone, 2,2'-bis(4-aminophenyl)propane, 2,2'-trifluoromethyl-4,4'-diaminobiphenyl, 2,2',6,6'-tetramethyl-4,4'-diaminobiphenyl, 2,2',6,6'-tetratrifluoromethyl-4,4'-diaminobiphenyl, bis{(4-aminophenyl)-2-propyl} 1,4-benzene, 9,9-bis(4-aminophenyl)fluorene, 9,9-bis(4-aminophenoxyphenyl)fluorene, 3,3'-dimethylbenzidine and 3,3'-dimethoxybenzidine, and diamines such as 2,6-diaminopyridine, 2,4-diaminopyridine, bis(4-aminophenyl-2-propyl)-1,4-benzene and diaminopolysiloxane. The aromatic diamine for imidation may be employed individually or in combination.

In general, polyimides having a high modulus of elasticity are straight rigid polymers, so that their solubilities in solvents are small. Therefore, to obtain a flexible printed board free from warping, it is important to design a PI-BO polymer having a molecular alignment which meets the demanded properties, i.e., solubility and high modulus of elasticity, which contradict to each other. To this end, it is preferred to use the above-mentioned aromatic diamine for imidation, and to form a block copolycondensate in which the molecular alignment is defined, rather than a random copolycondensate.

A block copolycondensate which is a PI-BO polymer according to the present may be obtained by a two-step polycondensation method in which an oligomer is produced by reacting a diamine and a tetracarboxylic dianhydride such that one of these reactants is used in excess, and then a diamine and/or tetracarboxylic dianhydride is(are) added (the molar ratio of the total aromatic diamines to the total tetracarboxylic dianhydride is 1.05 to 0.95). A variety of processes according to this method are concretely described in the Examples below. A polycondensate containing not less than 4 components may be produced by increasing the number of times of addition of each monomer accordingly.

Even when the aromatic diamine for imidation is not used, a block copolycondensate may be obtained by using not less than two tetracarboxylic dianhydrides and/or not less than two aromatic diamines having an amino group and a phenolic hydroxyl group which are located at ortho positions with respect to each other.

The discovery that a solvent-soluble PI-BO polymer is formed by heating the tetracarboxylic dianhydride(s) and the aromatic diamine(s) having an amino group and a phenolic hydroxyl group which are located at ortho positions with respect to each other at 150° C. to 220° C. in the presence of an acid catalyst is a novel discovery originally discovered by the present inventors, and the PI-BO polymer per se is also novel. How the new discovery was experimentally made and confirmed will now be described.

The present inventors studied in detail the solvent-soluble polycondensate obtained by heating a tetracarboxylic dianhydride and a diamine having an ortho-aminophenol group in an organic polar solvent in the presence of an acid catalyst to dehydration-condense the reactants.

It was observed that this polycondensate showed behavior different from that of the conventional polyimides. As a result of measurements of molecular weight, molecular weight distribution, infrared spectrophotometry, thermal analysis and the like of the product, it was confirmed that the produced polymer was not a polyimide but a polycondensate containing a benzoimidazole component having a carboxyl group and an imide component having a phenolic hydroxyl group.

To clarify the structure and characteristics of the produced polycondensate, binary polycondensates were synthesized from diamines containing ortho-aminophenol and tetracarboxylic dianhydrides, and the characteristics of the polycondensates were compared.

A binary polycondensate from 2,2-bis(3,4-dicarboxyphenyl)hexafluoropropane (hereinafter referred to as "6FDA") and 3,3'-dihydroxy-benzidine; a binary polycondensate from bicyclooct-7-ene-2,3,5,6-tetracarboxylic dianhydride (hereinafter referred to as "BCD") and 3,3'-dihydroxy-benzidine; and a ternary polycondensate from 2 moles of biphenyltetracarboxylic dianhydride, 3,3'-dihydroxy-benzidine and 2,2-bis{4-(4-aminophenoxy) phenyl}hexafluoropropane (hereinafter referred to as "HFBAPP") were synthesized. The weight average molecular weights in terms of polystyrene of the polycondensates were 225,000, 134,000 and 46,200, respectively, and each of them was a single polymer (each product showed a sharp peak). In infrared spectrophotometry, absorption by imide bond is observed at 1785, 1773 and 1775 $cm^{-1}$, and absorption by C=N bond is observed at 1651, 1644 and 1650 $cm^{-1}$ Especially, the absorption by C=N bond near 1650 $cm^{-1}$ is an absorption which is not observed in ordinary polyimides.

With the polymer obtained by using 3,3'-dimethoxybenzidine instead of 3,3'-dihydroxy-benzidine, which was polycondensed with the tetracarboxylic dianhydride, the absorption by C=N bond near 1650 $cm^{-1}$ is not observed, but the absorption by imide bond at 1775 $cm^{-1}$ is simply observed. These results indicate that the polycondensate between the diamine having the ortho-aminophenol group and the tetracarboxylic dianhydride is not a mere polyimide but a polycondensate ("PI-BO" polymer) containing a benzoxazole component having a carboxylic group and an imide component having a phenolic hydroxyl group.

The route of formation of this PI-BO polymer is shown in Chart 1 as mentioned above. Benzoimidazole group is easily formed in the presence of an acid catalyst. The ratio of the formed benzoimidazole component and the formed polyimide component are defined by the composition and the reaction temperature. The composition of the PI-BO polymers did not vary between those obtained by the reaction at 180° C. using different acid catalysts.

Figure 2:
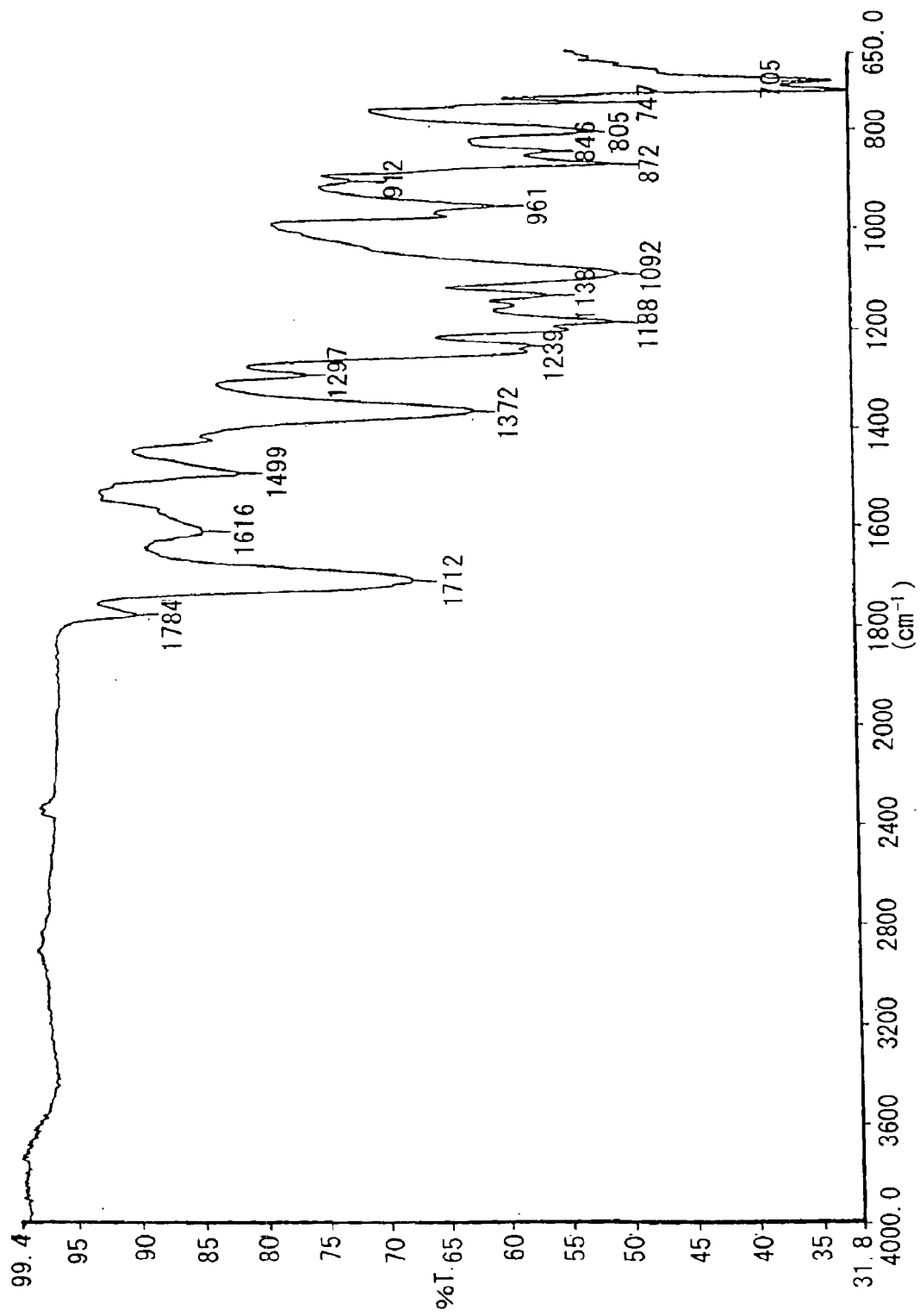
FIG. 2 is a graph showing the results of measurements of infrared absorption spectrum of the polycondensate prepared in Example 1 after heat treatment at 350° C. for 1 hour.

By heating the PI-BO polymer applied to a copper foil at 90° C. for 1 hour, or at 200° C. for 1 hour, no change was observed in the infrared absorption spectrum. However, by heating the polymer at 350° C. for 1 hour, the absorption by C—N bond at 1658 $cm^{-1}$ disappears and the absorption by imide bond at 1776 $cm^{-1}$ alone remains, and the absorption by carbonyl group at 1703 $cm^{-1}$ increases. Thus, by heating the PI-BO polymer at 300 to 350° C., it is converted to a polyimide (the manner of this change is shown in FIGS. 1 and 2). The manner of this change is shown in the reaction route shown in the above-described Chart 2.

The polycondensate obtained by the reaction between 1,2-anhydrodicarboxybenzene-5-acid chloride and 3,3'-hydroxy-benzidine shows absorptions at 1776 cm$^{-1}$ by imide bond and at 1644 cm$^{-1}$ by C=N bond in the infrared absorption spectrum. The benzoimidazole component formed therein contains benzoimidazole groups which do not have a carboxylic group. By heating this polycondensate at 350° C. for 1 hour after applying the polycondensate on a copper foil, the polycondensate is completely decomposed and does not substantially show infrared absorption spectrum. That is, the imidazole component which does not have a carboxylic group is decomposed by the heat treatment at 350° C.

By heating 1-hydroxy-2,4-diaminobenzene instead of 3,3'-dihydroxy-benzidine, and the tetracarboxylic dianhydride in the presence of an acid catalyst in an organic solvent at 180° C., a PI-BO polymer is formed. By heating this PI-BO polymer at 350° C. for 1 hour, the PI-BO polymer is converted to polyimide.

A quaternary block copolymer composed of two kinds of tetracarboxylic dianhydrides, the diamine containing an amino group and a phenolic hydroxyl group which are located at ortho positions with respect to each other, and the above-described aromatic diamine for imidation, was synthesized by sequential addition method (U.S. Pat. No. 5,502,143). This block copolymer is also a PI-BO polymer exhibiting the absorptions by C=N bond and by imide group in infrared absorption spectrum (i.e., containing both imide component and benzoxazole component). By heating this block copolymer at 350° C. for 1 hour, C=N bond disappears and the polymer becomes a polyimide (see FIGS. 4 and 5).

The molecular weight, molecular weight distribution, glass transition point, modulus of elasticity and coefficient of linear expansion of this block copolymer were measured. As a result, this polycondensate is a polymer having a high modulus of elasticity, and the molecular weight and the molecular weight distribution of the polymer containing the two components of PI-BO polymer are of a single polymer. Interestingly, this block copolymer exhibited two glass transition points and showed shrinkage at two different temperature ranges (see FIG. 3).

The first shrinkage range is the low temperature range of not higher than 100° C. (especially between 30° C. and 100° C.). Since the polymers treated at 90° C. and at 200° C. showed the same infrared spectrum, no change in composition occurs. This shrinkage is presumably caused by the interaction, i.e., hydrogen bond, between a carboxyl group and a hydroxyl group in different molecules in the PI-BO polymer.

The polycondensate synthesized using a diamine having an ortho-aminomethoxy group instead of the diamine having the ortho-aminophenol group does not exhibit this shrinkage. Ordinary polyimides also do not exhibit the shrinkage.

Figure 6:
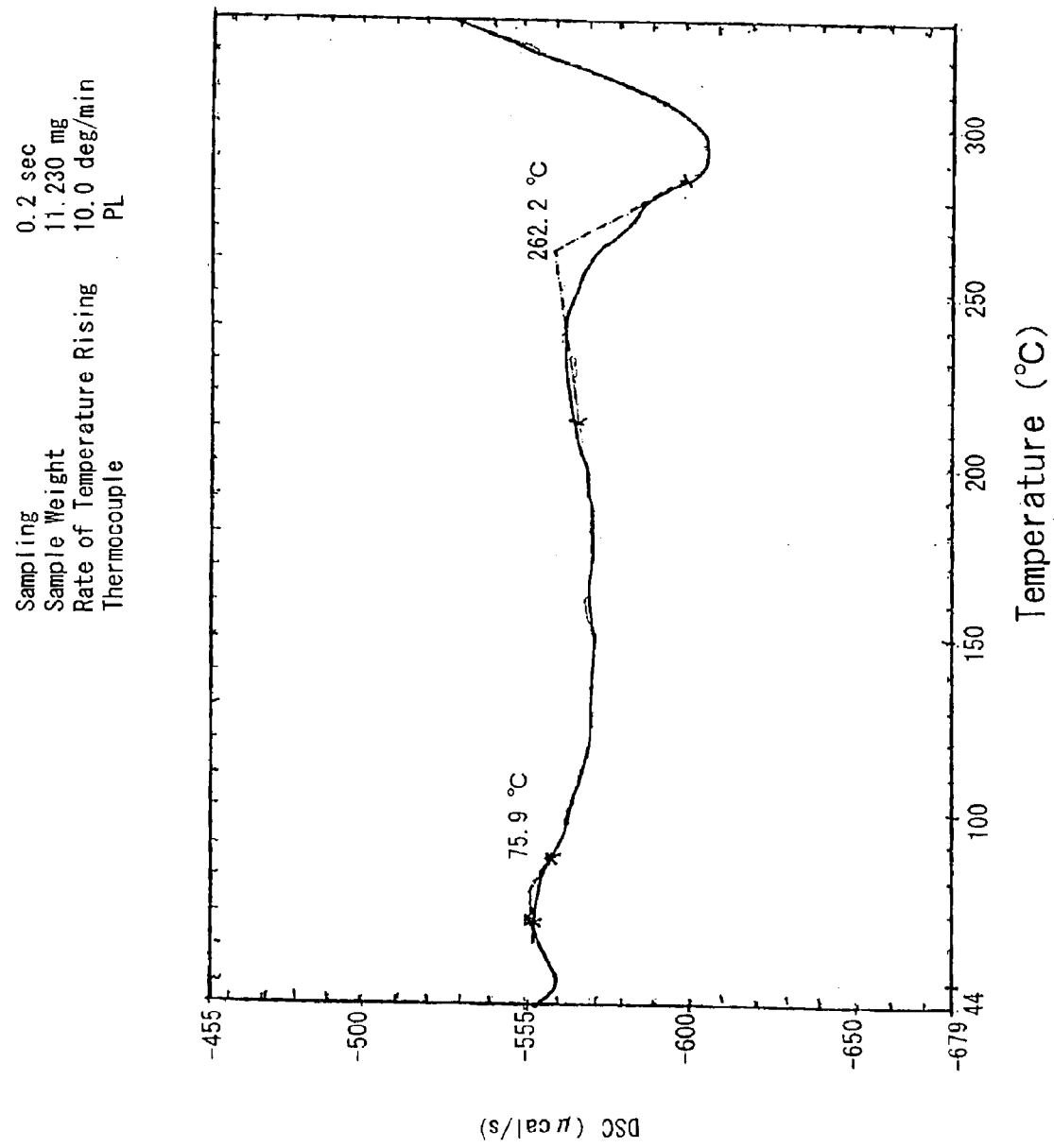
FIG. 6 is a graph showing the results of measurements of differential thermal analysis and glass transition point (Tg) of the copolymer.
Figure 7:
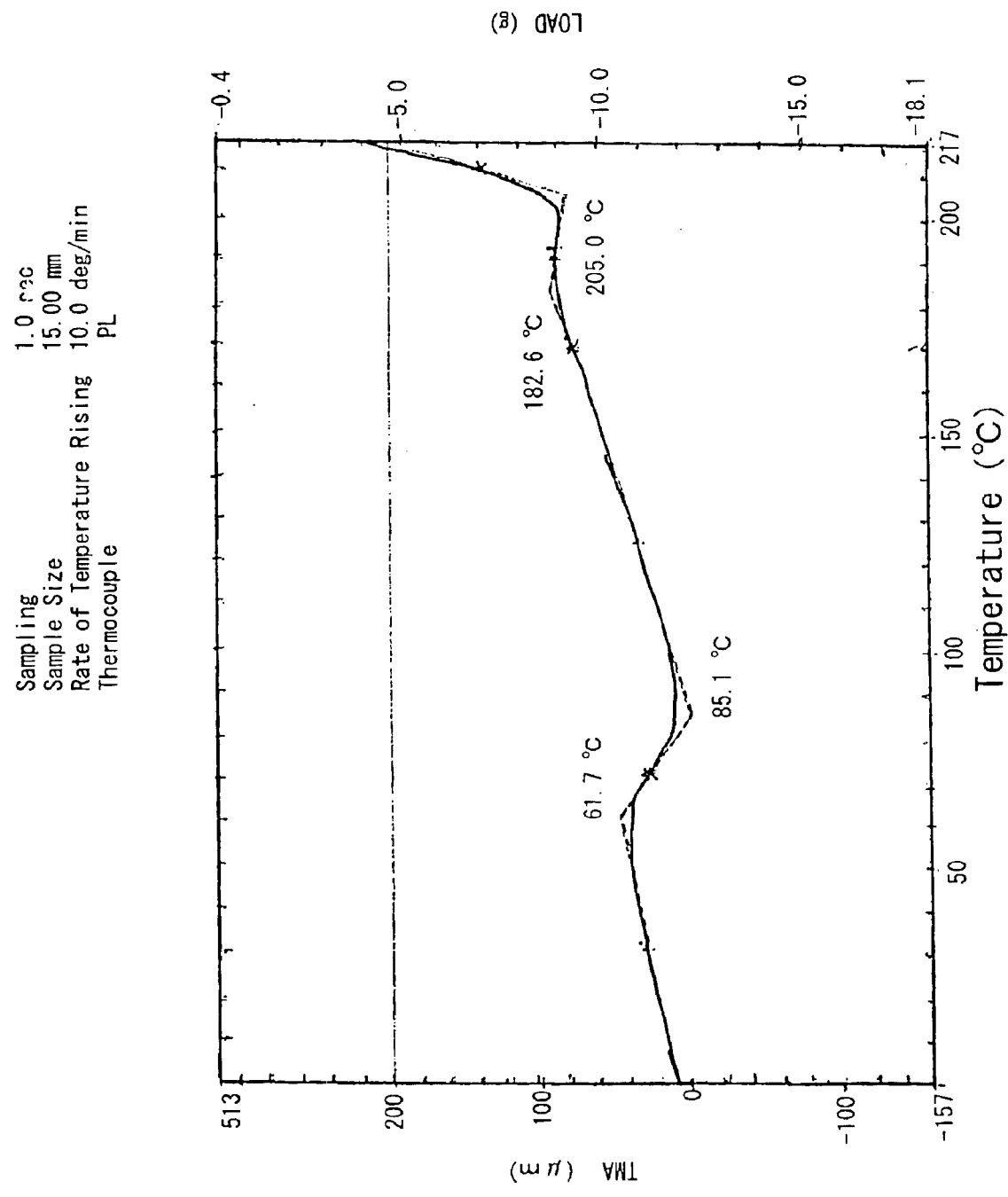
FIG. 7 is a graph showing coefficient of linear expansion of the copolymer prepared in Example 7.

The second shrinkage occurs in a temperature range near the glass transition point. FIGS. 6 and 7 show shrinkage properties in terms of glass transition points (Tg) measured by DSC and coefficient of linear expansion. A model of shrinkage of this PI-BO polymer is shown in the following formula:

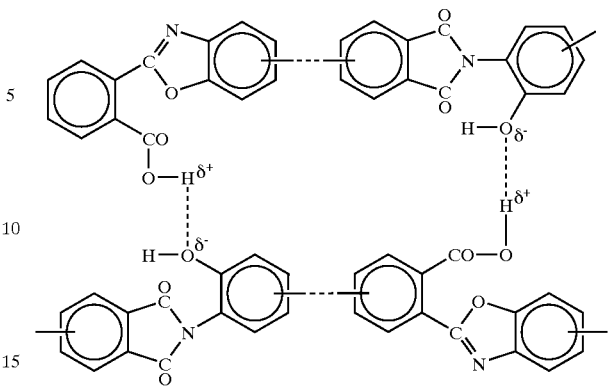

The copper foil-block copolymer laminate prepared by coating the copper foil with the BI-PO polymer according to the present invention and heating the resultant at 90° C. for 30 minutes and then at 200° C. for 1 hour is a laminate free from curling or warping. Thus, the laminate is a copper foil flexible printed board free from warping.

There are a number of references describing copper flexible printed board free from warping. In the methods described in these references, a siloxane component or an aliphatic component is mixed in an entirely aromatic polyimide. The entirely aromatic polyimides which do not contain ortho-aminophenol group usually give copper flexible printed board exhibiting large warping.

The polycondensate according to the present invention, which is a polymer having a constant molecular alignment and have hydroxyl groups and carboxyl groups in one molecule showed shrinkage by intermolecular interaction, i.e., hydrogen bonds. It is presumed that the copper foil flexible printed board does not warp or curl because the coefficients of expansion at room temperature and in the range of 150° C. to 200° C. are close.

Since the PI-BO polymer according to the present invention is obtained in the form of a solution when the polymer is produced by the process described above, the polymer in the form of solution may be used industrially as it is. The concentration of the PI-BO polymer in the solution is preferably 5 to 50% by weight, more preferably 10 to 40% by weight. If desired, however, the produced polyimide solution may be diluted with a diluent. As the diluent, a solvent which does not largely decrease the solubility, such as dioxane, dioxolane, y-butyrolactone, cyclohexanone, propylene glycol monomethyl ether acetate, methyl lactate, anisole, ethyl acetate or the like may be employed, although the diluent is not restricted to these.

The PI-BO polymer according to the present invention in the form of solution may be applied to a substrate, and may be used as an insulation film after being dried. By adding a photoacid generator, photosensitivity may be given to the polymer.

That is, the PI-BO polymer according to the present invention forms positive-type images by irradiating the polymer with a light after adding a photoacid generator, and then developing the resultant with an alkaline developer, preferably with amino alcohol solution.

The photoacid generator employed in the present invention is not restricted and any compound which generates an acid upon being irradiated with light or electron beam may be employed. Preferred examples of the photoacid generator include photosensitive quinone diazide compounds including esters of 1,2-naphthoquinone-2-diazide-5-sulfonic acid and 1,2-naphthoquinone-2-diazide-4-sulfonic acid, the counterparts of the esters being low molecular aromatic hydroxyl compounds such as 2,3,4-trihydroxybenzophenone, 1,3,5-trihydroxybenzene, 2- and 4-methylphenol and 4,4'-hydroxy-propane. The photoacid generator may be added in an amount of 0.05 to 0.3 based on the weight of the polycondensate.

Although the substrate to be coated with the photosensitive PI-BO composition is not restricted, to exhibit the advantageous effect that warping does not occur when coated on copper foil, copper foil is especially preferred.

Coating is usually performed by applying PI-BO solution on the substrate by a method such as immersion, spraying, roll-coating, spin-coating or the like.

After coating the substrate with the photosensitive PI-BO polymer composition, it is preferred to preliminarily dry the composition at a temperature between 80° C. and 120° C. In this case, although an oven or hot plate may be used, heating by an infrared heater is preferred. The time for drying may be about 5 to 20 minutes. The coating thickness after the drying is not restricted, and usually about 1 to 50 µm is suitable.

Thereafter, the photosensitive PI-BO polymer layer is subjected to irradiation. Usually, UV light is used, but high energy radiation, such as X-ray, electron beam or high power oscillation beam from an extra-high pressure mercury lamp may be employed. Irradiation or exposure is carried out through a mask, or the surface of the photosensitive polyimide layer may also be directly irradiated with a beam. Irradiation is usually carried out using a UV lamp which emits a light having a wavelength of 250 to 450 nm, preferably 300 to 400 nm. Exposure may be carried out using monochromatic ray or polychromatic ray. It is preferred to use a commercially available irradiation apparatus, such as a contact or interlayer exposer, scanning projector or a wafer stepper.

After exposure, by treating the photosensitive layer with an alkaline developer, the irradiated regions may be removed. This treatment may be carried out by immersion or by spraying with pressure of the developer, thereby dissolving the exposed regions. The alkali employed as the developer is not restricted, and examples thereof include amino alcohols such as aminoethanol, methylmorpholine, potassium hydroxide, sodium hydroxide, sodium carbonate, dimethylaminoethanol and tetramethylammonium hydroxide. The concentration of the alkali in the developer is not restricted, and is usually about 30 to 5% by weight.

The duration of development varies depending on the exposure energy, strength of the developer, mode of development, pre-drying temperature, the temperature of the developer and the like. In general, in immersion development, the developing time is usually about 1 to 10 minutes, and in spray development, the developing time is usually about 10 to 60 seconds. The development is stopped by immersing the film in an inactive solvent such as isopropanol or in deionized water, or by spraying such a liquid on the film.

Positive-type images are usually formed by adding a photoacid generator to a novolak resin, irradiating the composition and then developing the resulting composition. In this case, it is explained that the novolak resin has a low molecular weight of not more than 10,000, and the solubility in aqueous alkaline solution is increased by the hydroxyl groups in the novolak resin and the carboxyl groups in the photoacid generator.

To use as an insulation film, the polycondensate according to the present invention is a high molecular polymer having a weight average molecular weight in terms of polystyrene of not less than 30,000. If the weight average molecular weight is not more than 30,000, strong insulation film is not formed. High molecular polymers are not easily dissolved in alkaline solution. The polymer is not dissolved in an alkaline solution upon irradiated with light in the presence of a photoacid generator due to the interaction between the hydroxyl groups or carboxyl groups and the carboxylic acid generated by the light irradiation, but dissolved due to decomposition to low molecular compounds by the amino alcohol-containing developer, so as to form positive-type images.

As described in Example 14, the molecular weight of a polymer in the light-irradiated regions in the coating layer containing the polymer having a weight average molecular weight of 68,300 and a photoacid generator was 70,600, so that the molecular weight was not substantially changed. However, upon immersing the irradiated polymer in aminoethanol-containing solution, the light-irradiated regions are dissolved. The molecular weights of the dissolved compounds were measured to find that most of them were low molecular compounds having a molecular weight of 3000.

On the other hand, the light-irradiated regions were dissolved in dimethylformamide and the molecular weight was measured, which was 70,600, so that no change in the weight average molecular weight was observed. However, by leaving the solution after adding a small amount of aminoethanol, it was observed that the polymer was easily decomposed to low molecular compounds having a weight average molecular weight of 3510.

It is presumed that the BI-PO polymer according to the present invention, which is a polycondensate containing a benzoxazole component having a carboxyl group and an imide component having a phenolic hydroxyl group, is converted to an amic acid by the photoacid generator and decomposed by the aminophenol-containing developer to low molecular weight compounds having a molecular weight of about 3000, thereby being dissolved.

The process of decomposition by the photoacid is shown in Chart 4, and the process of decomposition by the developer is shown in Chart 5. In these Charts, photoacid is indicated as "photoacid" and the amino alcohol is indicated as "amino alcohol" in English.

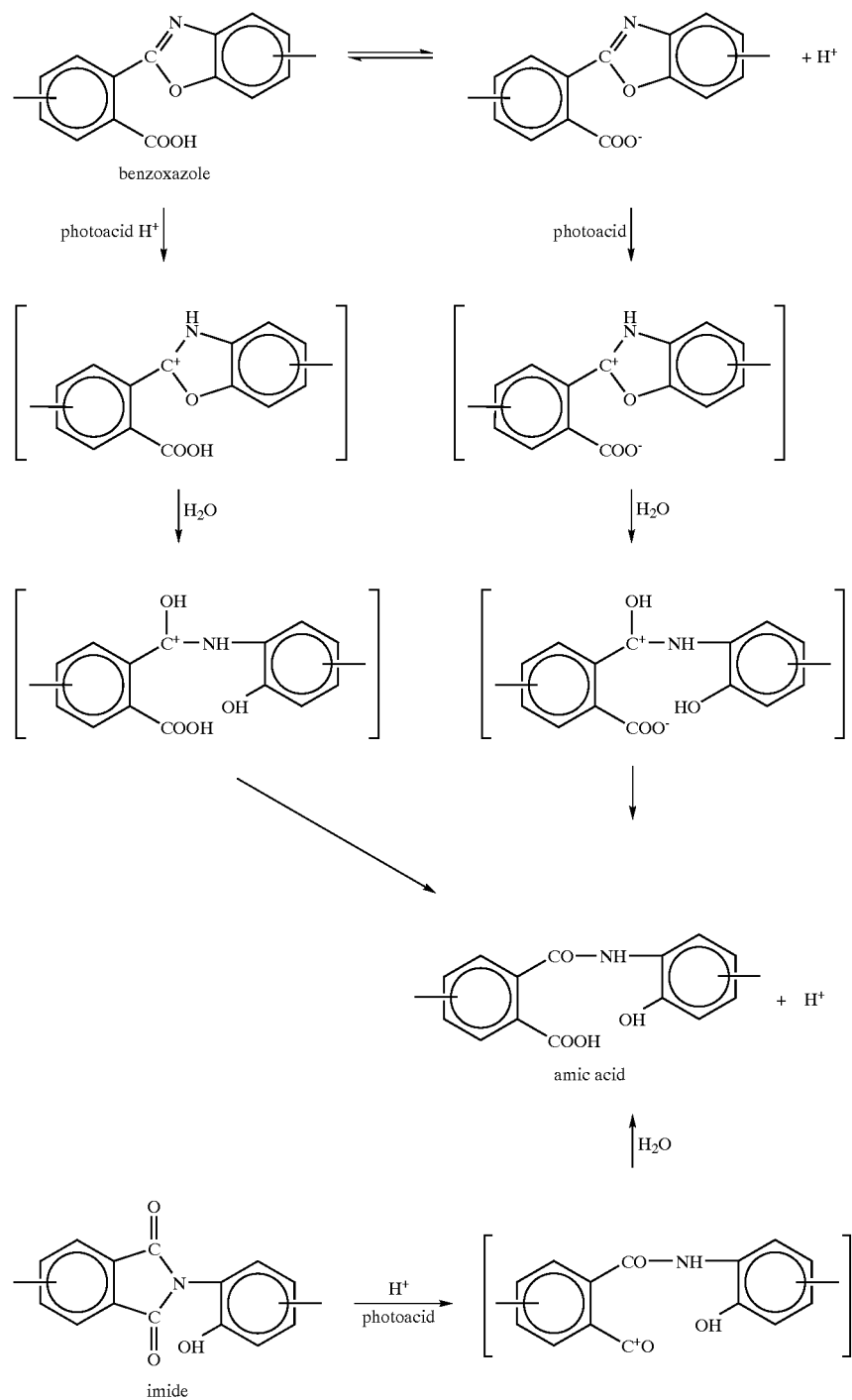

Chart 5

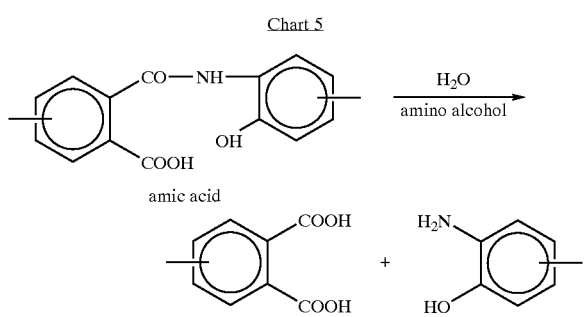

In contrast, the fact that the imide groups in an entirely aromatic polyimide is decomposed by the photoacid to form positive images will be shown in a comparative example. The polyimides which do not have hydroxyl groups or carboxylic groups form positive-type images by irradiating the polyimide in the presence of the photoacid, and by dissolving the resultant with an amino alcohol-containing developer.

By coating the resin according to the present invention on a copper foil together with the photoacid generator, preheating the composition, irradiating the composition with light, and developing the resultant with an amino alcohol-containing developer, a line-and-space pattern of 15 μm interval as well as through holes of 15 μm diameter are clearly formed. Although the substrate may be used as a circuit board as it is, if desired, the composition may be heated at 350° C. so as to form a polyimide circuit board.

EXAMPLES

The present invention will now be described in detail referring to some examples thereof. Since various characteristic polycondensates are obtained by various combinations of acid dianhydrides and aromatic diamines, the present invention is not restricted to these examples.

Example 1

(Production of Polycondensate and Characteristics thereof)

To a three-necked separable flask made of glass equipped with a stainless steel anchor agitator and reflux condenser, a condenser comprising a trap and a cooling tube having balls and mounted on the trap was attached. The flask was heated by immersing the flask in a silicone oil bath under stirring under nitrogen gas flow.

To the flask, 26.66 g (60 mmol) of 2,2-bis(3,4-dicarboxyphenyl)hexafluoropropane dianhydride (hereinafter referred to as "6FDA"), 12.97 g (60 mmol) of 3,3'-dihydroxybenzidine (hereinafter referred to as "HO-AB"), 0.6 g (6 mmol) of γ-valerolactone, 1.8 g (18 mmol) of pyridine, 150 g of N-methylpyrrolidone (hereinafter referred to as "NMP") and 30 g of toluene were added, and the mixture was heated at a silicone bath temperature of 180° C. under nitrogen gas flow under stirring at 180 rpm for 1 hour and 40 minutes. During the reaction, distillate of toluene and water (toluene 25 g, water 3 g) was removed. After the reaction, 62 g of NMP was added to obtain a 15% polycondensate solution.

An aliquot of this solution was diluted with dimethylformamide and the molecular weight and molecular weight distribution were measured by using high performance liquid chromatography (commercially available from TOSOH). The molecular weights based on polystyrene were: Most Frequent Molecular Weight (M): 179,000, Number Average Molecular Weight (Mn): 79,000; Weight Average Molecular Weight (Mw): 225,000; Z Average Molecular Weight (Mz): 447,000, Mw/Mn=2.88, Mz/Mn=5.72. The molecular weight distribution was a single sharp curve, so that the obtained product was a single product.

The reaction solution was cast on a copper foil with a thickness of 18 μm and heated at 90° C. for 1 hour in an infrared drying furnace such that the final thickness of the coated resin was 20 μm.

Infrared absorption spectrum (reflected light) was measured using an infrared spectrophotometer SPECTRAONE commercially available from Perkin-Elmer. The infrared spectrum chart is shown in FIG. 1. It shows absorptions at 1785 cm$^{-1}$ (imide bond), 1720 cm$^{-1}$ (C=O bond) and 1651 cm$^{-1}$ (C=N bond). From the area ratio, it can be seen that the molar ratio of the imide component to the benzoxazole component in the polycondensate is 0.45:0.55. The coated polycondensate after the heat treatment at 90° C. for 1 hour was heated at 200° C. for 30 minutes, and the infrared absorption spectrum was measured. As a result, the infrared absorption spectrum did not change from that of the sample heated at 90° C. The sample heated at 200° C. was further heated at 350° C. for 1 hour in a furnace. The infrared absorption spectrum of this sample was measured. As a result, although it showed absorptions at 1784 cm$^{-1}$ (imide bond) and 1712 cm$^{-1}$ (C=O bond), the absorption at 1651 cm$^{-1}$ (C=N bond) disappeared.

Example 2

A polycondensate solution was prepared as in Example 1.
(Production of Polycondensate Solution)

To the flask, 24.82 g (100 mmol) of bicyclo(2,2,2)-oct-7-ene-2,3,5,6-tetracarboxylic dianhydride (hereinafter referred to as "BCD"), 21.62 g (100 mmol) of 3,3'-dihydroxy-benzidine (hereinafter referred to as "HO-AB"), 1.0 g (10 mmol) of γ-valerolactone, 2.4 g (30 mmol) of pyridine, 171 g of N-methylpyrrolidone and 30 g of toluene were added and the mixture was heated at a silicone bath temperature of 180° C. under stirring at 180 rpm for 65 minutes and then at 100 rpm for 35 minutes. During the reaction, distillate of toluene and water was removed. After the reaction, 71 g of NMP was added to obtain a 15% polycondensate solution.

The molecular weights based on polystyrene of the thus produced polycondensate solution were: Most Frequent Molecular Weight (M): 1117,000, Number Average Molecular Weight (Mn): 56,000; Weight Average Molecular Weight (Mw): 134,000; Z Average Molecular Weight (Mz): 245,000, Mw/Mn=2.40, Mz/Mn=4.53.

The polycondensate solution was cast on a copper foil with a thickness of 18 μm and heated at 90° C. for 1 hour in an infrared drying furnace such that the final thickness of the coated resin was 20 μm.

Infrared absorption spectrum (reflected light) was measured using an infrared spectrophotometer SPECTRAONE commercially available from Perkin-Elmer. It shows absorptions at 1773 cm$^{-1}$ (imide bond), 1698 cm$^{-1}$ (C=O bond) and 1644 cm$^{-1}$ (C=N bond). From the area ratio, it can be seen that the molar ratio of the imide component to the benzoxazole component in the polycondensate is 0.56:0.44. The coated polycondensate after the heat treatment at 90° C. for 1 hour was heated at 200° C. for 30 minutes, and the infrared absorption spectrum was measured. As a result, the infrared absorption spectrum did not change from that of the sample heated at 90° C. The sample heated at 200° C. was further heated at 350° C. for 1 hour in a furnace. The infrared absorption spectrum of this sample was measured. As a result, although it showed absorptions at 1770 cm$^{-1}$ (imide bond) and 1699 cm⁻¹ (C=O bond), the absorption at 1644 cm⁻¹ (C=N bond) disappeared.

Example 3

A polycondensate solution was prepared as in Example 1.
(Production of Polycondensate Solution)

To the flask, 29.42 g (100 mmol) of 3,4,3',4'-biphenyltetracarboxylic dianhydride (hereinafter referred to as "BPDA"), 10.81 g (50 mmol) of HO-AB, 22.21 g (50 mmol) of 2,2-bis(3-aminophenoxyphenyl)hexafluoropropane (hereinafter referred to as "HFBAPP"), 1.0 g (10 mmol) of γ-valerolactone, 2.4 g (30 mmol) of pyridine, 235 g of N-methylpyrrolidone and 30 g of toluene were added and the mixture was heated at a silicone bath temperature of 180° C. under stirring at 180 rpm for 60 minutes. During the reaction, distillate of toluene and water was removed.

The molecular weights based on polystyrene of the thus produced polycondensate solution were: Most Frequent Molecular Weight (M): 42,000, Number Average Molecular Weight (Mn): 23,000; Weight Average Molecular Weight (Mw): 46,000; Z Average Molecular Weight (Mz): 91,000. Mw/Mn=2.02, Mz/Mn=3.53.

The polycondensate solution was cast on a copper foil with a thickness of 18 μm and heated at 90° C. for 1 hour in an infrared drying furnace such that the final thickness of the coated resin was 20 μm.

Infrared absorption spectrum (reflected light) was measured using an infrared spectrophotometer SPECTRAONE commercially available from Perkin-Elmer. It shows absorptions at 1774 cm⁻¹ (imide bond), 1714 cm⁻¹ (C=O bond) and 1652 cm⁻¹ (C=N bond). From this, it can be seen that the molar ratio of the imide component to the benzoxazole component in the polycondensate is 0.59:0.41. The coated polycondensate after the heat treatment at 90° C. for 1 hour was heated at 200° C. for 30 minutes, and the infrared absorption spectrum was measured. As a result, the infrared absorption spectrum did not change from that of the sample heated at 90° C.

The sample heated at 200° C. was further heated at 350° C. for 1 hour in a furnace. The infrared absorption spectrum of this sample was measured. As a result, although it showed absorptions at 1774 cm⁻¹ (imide bond) and 1698 cm⁻¹ (C=O bond), the absorption at 1652 cm⁻¹ (C=N bond) disappeared.

Example 4

Polycondensate solutions were prepared as in Example 1 changing the polycondensation catalyst.
(Production of Polycondensate Solution)

To the flask, 17.77 g (40 mmol) of 6FDA, 8.65 g (40 mmol) of HO-AB, the catalyst for polycondensation described below, 142 g of N-methylpyrrolidone and 30 g of toluene were added and the mixture was heated at a silicone bath temperature of 180° C. under stirring at 180 rpm for 60 minutes. During the reaction, distillate of toluene and water was removed.

1) As the catalyst, 0.76 g (4 mmol) of p-toluenesulfonic acid,
2) As the catalyst, 2.16 g (20 mmol) of m-cresol.
3) As the catalyst. 2.0 g (20 mmol) of benzoic acid.

The results of measurements of molecular weights based on polystyrene of the thus produced polycondensate solutions are shown in Table I below.

TABLE 1

| Catalyst | M | Mn | Mw | Mz |
|---|---|---|---|---|
| 1) | 253,000 | 89,000 | 345,000 | 736,000 |
| 2) | 402,000 | 108,000 | 480,000 | 980,000 |
| 3) | 1,155,000 | 119,000 | 746,000 | 1,703,000 |

The polycondensate solution was cast on a copper foil with a thickness of 18 μm and heated at 90° C. for 1 hour in an infrared drying furnace such that the final thickness of the coated resin was 20 μm.

Infrared absorption spectrum (reflected light) was measured using an infrared spectrophotometer SPECTRAONE commercially available from Perkin-Elmer. The absorptions at 1785 cm⁻¹ (imide bond), 1715 cm⁻¹ (C=O bond) and 1651 cm⁻¹ (C=N bond) did not vary relatively, so that the composition ratios of the imide component to the benzoxazole component of the polycondensates with different molecular weights produced by using different types of catalyst did not vary.

Comparative Example 1

A polycondensate solution was prepared as in Example 1.
(Production of Polycondensate Solution)

To the flask, 21.0 g (100 mmol) of anhydrous trimellitic chloride, 21.62 g (100 mmol) of HO-AB, 16.2 g of pyridine, 200 g of N-methylpyrrolidone and 45 g of toluene were added and the mixture was heated at a silicone bath temperature of 180° C. under stirring at 180 rpm for 120 minutes.

The polycondensate solution was cast on a copper foil with a thickness of 18 μm and heated at 90° C. for 30 minutes and then at 200° C. for 30 minutes in an infrared drying furnace such that the final thickness of the coated resin was 20 μm.

Infrared absorption spectrum (reflected light) was measured using an infrared spectrophotometer SPECTRAONE commercially available from Perkin-Elmer. It shows absorptions at 1770 cm⁻¹ (imide bond), 1713 cm⁻¹ (C=O bond) and 1644 cm⁻¹ (C=N bond) and 1605 cm⁻¹. The film coated on the copper foil was further heated at 350° C. in a heating furnace for 1 hour and infrared absorption spectrum was measured. However, most of the product was thermally decomposed and absorption characteristics were not observed.

Example 5

A polycondensate solution was prepared as in Example 1.
(Production of Polycondensate Solution)

To the flask, 17.65 g (60 mmol) of BPDA, 5.91 g (30 mmol) of 1-hydroxy-2,4-diaminobenzene dihydrochloride, 12.32 g (30 mmol) of 2,2-bis(3-aminophenoxyphenyl)propane, 1.0 g (10 mmol) of γ-valerolactone, 10 g (100 mmol) of N-methylmorpholine, 135 g of N-methylpyrrolidone and 40 g of toluene were added and the mixture was heated at a silicone bath temperature of 180° C. under stirring at 180 rpm for 60 minutes. After the reaction, 56 g of NMP was added to obtain a 15% polycondensate solution.

The molecular weights based on polystyrene of the thus produced polycondensate solution were: Most Frequent Molecular Weight (M): 54,000, Number Average Molecular Weight (Mn): 31,700; Weight Average Molecular Weight (Mw): 57,200; Z Average Molecular Weight (Mz): 99,500.

The polycondensate solution was cast on a copper foil with a thickness of 18 μm and heated at 90° C. for 1 hour in an infrared drying furnace such that the final thickness of the coated resin was 20 μm.

Infrared absorption spectrum (reflected light) was measured using an infrared spectrophotometer SPECTRAONE commercially available from Perkin-Elmer. It shows absorptions at 1773 cm$^{-1}$ (imide bond) 1713 cm$^{-1}$ (C=O bond) and 1657 cm$^{-1}$ (C=N bond). From this, it can be seen that the molar ratio of the imide component to the benzoxazole component in the polycondensate is 0.8:0.2. The sample was further heated at 350° C. for 1 hour in a furnace. The infrared absorption spectrum of this sample was measured. As a result, although it showed absorptions at 1772 cm$^{-1}$ (imide bond) and 1707 cm$^{-1}$ (C=O bond), the absorption at 1657 cm$^{-1}$ (C=N bond) disappeared.

Example 6

A polycondensate solution was prepared as in Example 1.
(Production of Polycondensate Solution)

To the flask, 14.81 g (60 mmol) of BCD, 6.49 g (30 mmol) of HO-AB, 0.9 g (9 mmol) of γ-valerolactone, 1.5 g (18 mmol) of pyridine, 83 g of N-methylpyrrolidone and 20 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 8.83 g (30 mmol) of BPDA, 8.77 g (30 mmol) of bis(3-aminophenoxy)-1,3-benzene, 6.01 g (30 mmol) of 4,4'-diamino-diphenyl ether, 84 g of NMP and 20 g of toluene were added, followed by stirring the mixture at room temperature for 1 hour. The resulting mixture was heated at 180° C. under stirring at 180 rpm for 2 hours and the refluxed solution was removed. The mixture was then heated at 180° C. for 1 hour and 50 minutes at 100 rpm. The polycondensate after the reaction was in the form of a solution with a resin concentration of 20%.

The molecular weights based on polystyrene of the thus produced polycondensate solution were: Most Frequent Molecular Weight (M): 64,500, Number Average Molecular Weight (Mn): 33,100; Weight Average Molecular Weight (Mw): 71,800; Z Average Molecular Weight (Mz): 130,300.

The polycondensate solution was cast on a copper foil with a thickness of 18 μm and heated at 90° C. for 1 hour in an infrared drying furnace such that the final thickness of the coated resin was 20 μm.

Infrared absorption spectrum (reflected light) was measured using an infrared spectrophotometer SPECTRAONE commercially available from Perkin-Elmer. It shows absorptions at 1774 cm$^{-1}$ (imide bond), 1703 cm$^{-1}$ (C=O bond) and 1658 cm$^{-1}$ (C=N bond). From this, it can be seen that the molar ratio of the imide component to the benzoxazole component in the polycondensate is 0.87:0.13. The sample was further heated at 350° C. for 1 hour in a furnace. The infrared absorption spectrum of this sample was measured. As a result, although it showed absorptions at 1774 cm$^{-1}$ (imide bond) and 1703 cm$^{-1}$ (C=O bond), the absorption at 1658 cm$^{-1}$ (C=N bond) disappeared.

Figure 3:
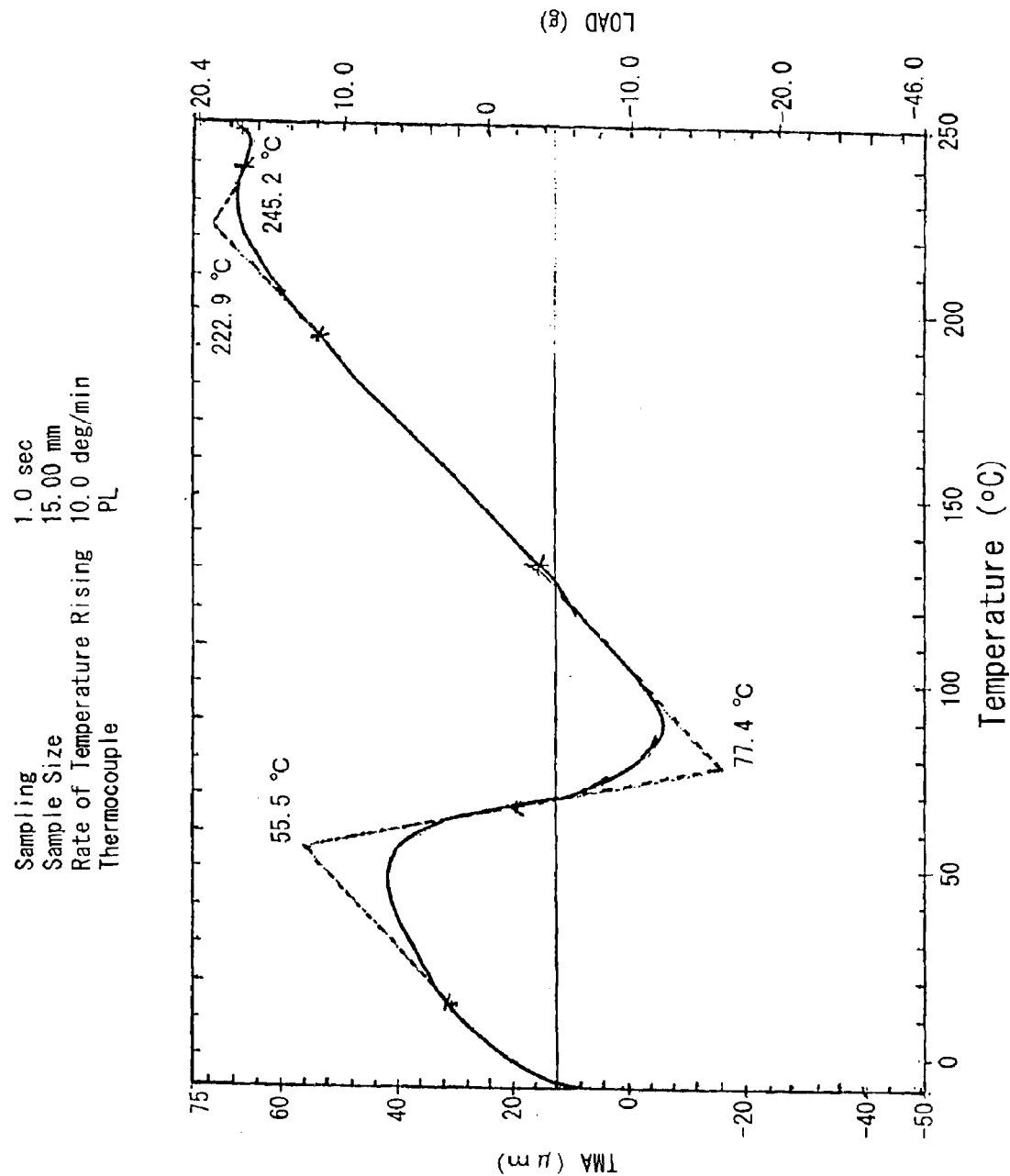
FIG. 3 is a graph showing a linear expansion curve of the polycondensate prepared in Example 6.

The DSC of this polycondensate was measured. The differential calorie decreased from 170° C. and the Tg was 203° C. The linear coefficient of expansion was also measured (TMA). The measurement results are shown in FIG. 3 and Table 2 below. The polycondensate elongates in the temperature range between 0° C. and 50° C. The polycondensate shrinks in the temperature range between 50° C. and 90° C. It elongates again from 90° C. to 230° C. It shrinks in the temperature range of 230° C. and 250° C., and it elongates in the temperature range of not lower than 250° C.

TABLE 2

| Measurement Temperature (° C.) | Coefficient of Expantion*1) | Coefficient of Linear Expansion*2) |
|---|---|---|
| 30 | 1.10 | 3.67 |
| 90 | -1.82 | -2.02 |
| 180 | 1.65 | 0.92 |
| 230 | 3.10 | 1.35 |
| 240 | 2.99 | 1.25 |
| 250 | 3.12 | 1.25 |

*1): ×10$^{-3}$
*2): ×10$^{-5}$/K (Warping Test of Polycondensate)

The polycondensate is coated on a copper foil having a thickness of 25 μm, and cured at 90° C. while clamping the foil with a metal frame. Twenty four hours later, the foil is removed from the metal frame. The polycondensate coating (resin thickness was 20 μm) on the 35 mm×35 mm copper foil was post-cured by leaving the coated foil at 90° C. for 30 minutes, at 150° C. for 30 minutes or at 230° C. for 30 minutes, and the degree of warping of the copper foil/polycondensate films was measured. Each of them was placed on a flat plane, and the maximum distance from the plane was measured. The measured distance of any of them was not more than 1.0 mm.

Example 7

A polycondensate solution was prepared as in Example 6.
(Production of Polycondensate Solution)

To the flask, 19.33 g (60 mmol) of 3,4,3',4'-benzophenonetetracarboxylic dianhydride, 12.98 g (30 mol) of bis{4-(4-aminophenoxy)phenyl}sulfone, 1.2 g (12 mmol) of γ-valerolactone, 1.9 g (24 mmol) of pyridine, 150 g of N-methylpyrrolidone and 30 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 17.60 g (60 mmol) of BPDA, 6.49 g (30 mmol) of HO-AB, 12.01 g (60 mmol) of 3,4'-diaminodiphenyl ether, 106 g of NMP and 20 g of toluene were added, followed by stirring the mixture at room temperature for 1 hour. The resulting mixture was heated at 180° C. under stirring at 180 rpm for 1 hour and the refluxed solution was removed. The mixture was then heated at 180° C. for 1 hour at 100 rpm. After the reaction. 100 g of NMP was added. The polycondensate was in the form of a solution with a resin concentration of 15%.

The molecular weights based on polystyrene of the thus produced polycondensate solution were: Most Frequent Molecular Weight (M): 76,300, Number Average Molecular Weight (Mn): 37,500; Weight Average Molecular Weight (Mw): 180,000; Z Average Molecular Weight (Mz): 362,000.

The polycondensate solution was cast on a copper foil with a thickness of 18 μm and heated at 90° C. for 1 hour in an infrared drying furnace such that the final thickness of the coated resin was 20 μm.

Figure 4:
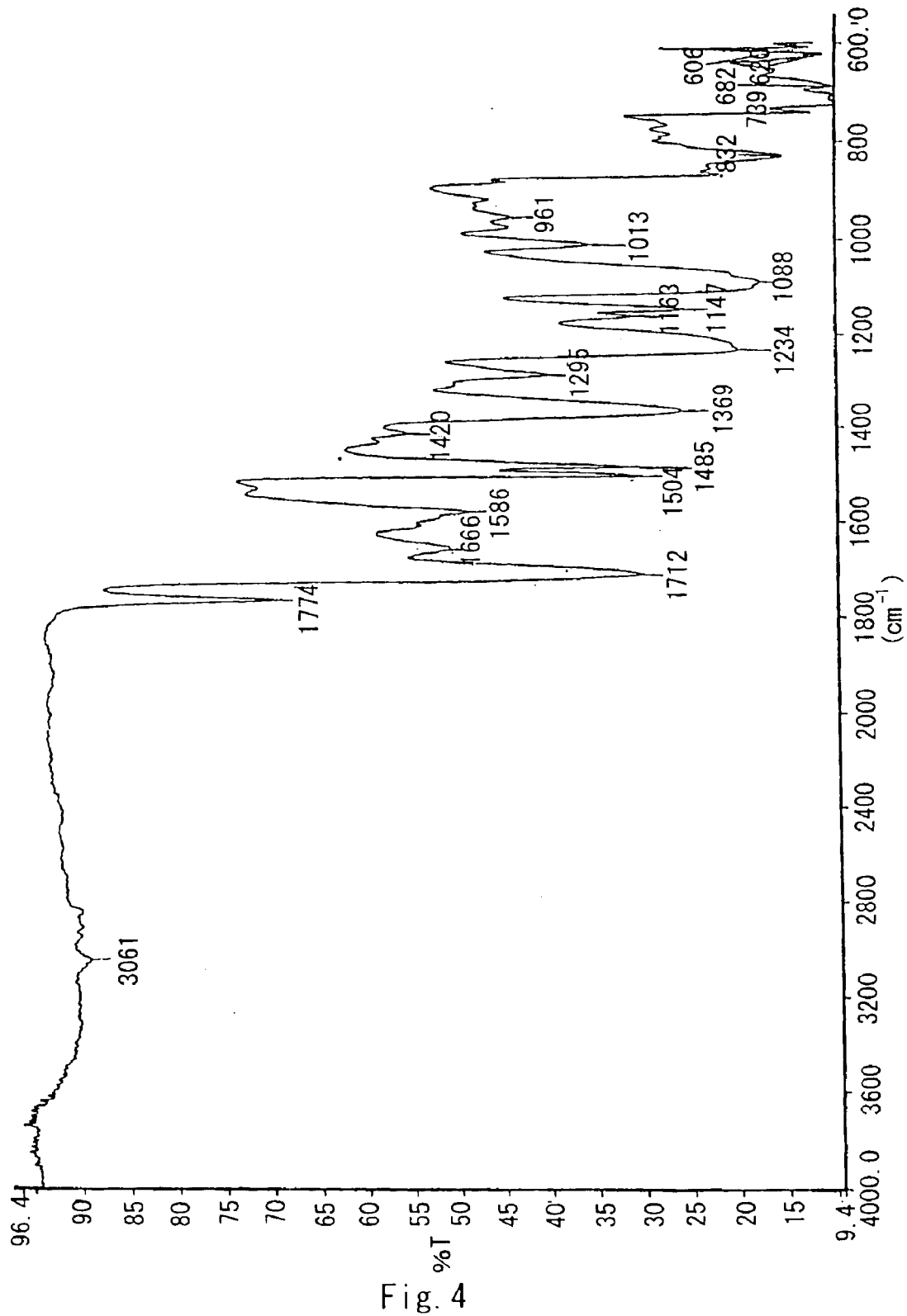
FIG. 4 is a graph showing the results of measurements of infrared absorption spectrum of the copolymer prepared in Example 7.
Figure 5:
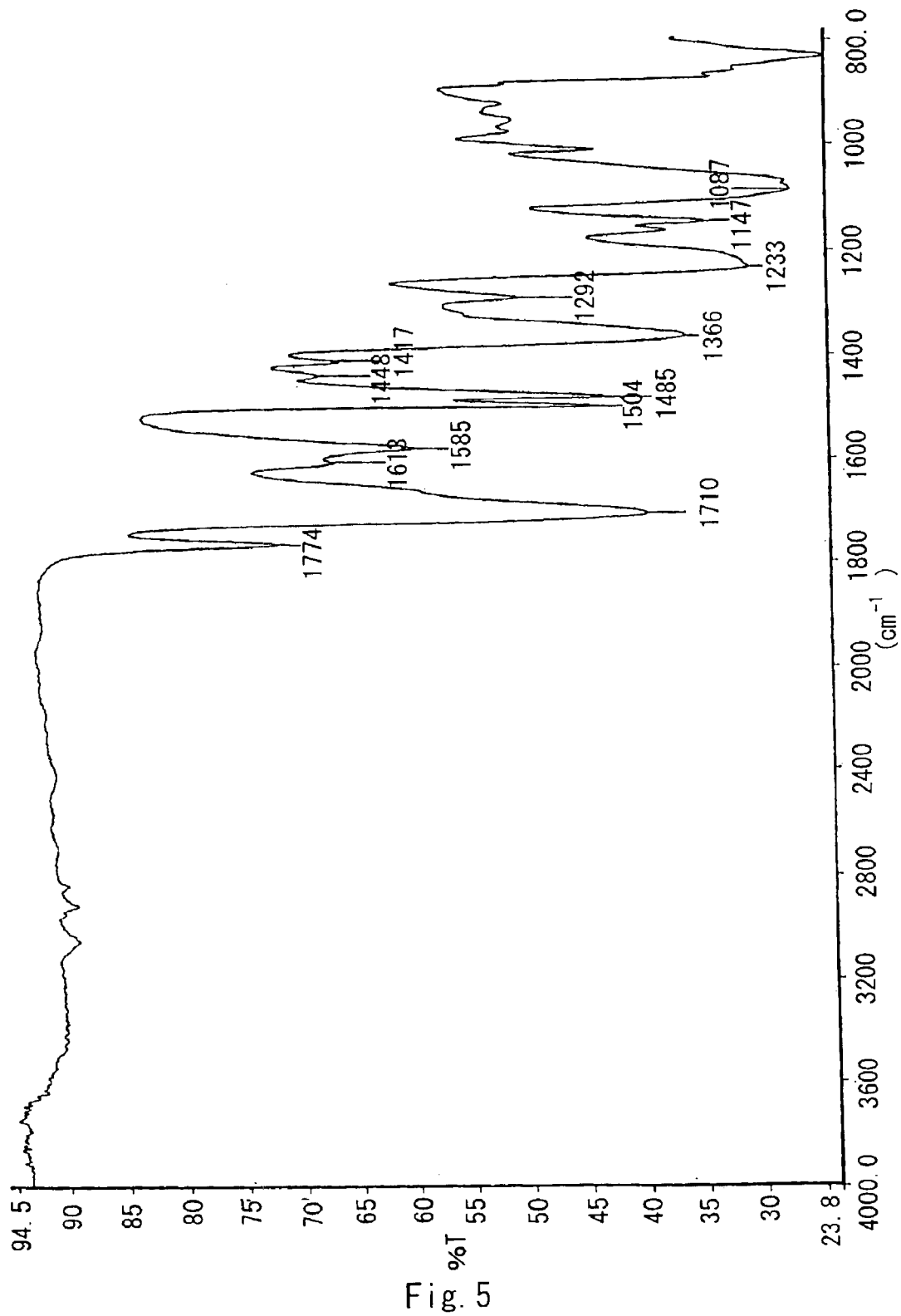
FIG. 5 is a graph showing the results of measurements of infrared absorption spectrum of the copolymer prepared in Example 7 after heat treatment at 350° C. for 1 hour.

Infrared absorption spectrum (reflected light) of the coated polycondensate resin was measured using an infrared spectrophotometer SPECTRAONE commercially available from Perkin-Elmer. It shows absorptions at 1774 cm$^{-1}$ (imide bond), 1712 cm$^{-1}$ (C=O bond) and 1667 cm$^{-1}$ (C=N bond) (FIG. 4). From this, it can be seen that the molar ratio of the imide component to the benzoxazole component in the polycondensate is 0.71:0.29. The sample was further heated at 350° C. for 1 hour in a furnace. The infrared absorption spectrum of this sample was measured. As a result, although it showed absorptions at 1774 cm$^{-1}$ (imide bond) and 1703 cm$^{-1}$ (C=O bond), the absorption at 1667 cm$^{-1}$ (C=N bond) disappeared (see FIG. 5).

The DSC of this polycondensate was measured. There are two Tgs in the vicinity of 76° C. and 203° C. (see FIG. 6).

The linear coefficient of expansion was also measured (TMA). The measurement results are shown in FIG. 7 and Table 3 below. The polycondensate shrinks in the temperature range between 60° C. and 90° C., and shrinks again from 185° C. to 200° C.

TABLE 3

| Measurement Temperature (° C.) | Coefficient of Expantion*1) | Coefficient of Linear Expansion*2) |
| --- | --- | --- |
| 30 | 0.13 | 4.43 |
| 60 | 0.21 | 3.53 |
| 85 | 0.01 | 0.16 |
| 185 | 0.53 | 2.87 |
| 200 | 0.52 | 0.58 |
| 215 | 1.22 | 5.69 |

*1): ×10$^{-3}$
*2): ×10$^{-5}$/K (Warping Test of Polycondensate)

The polycondensate was coated on a copper foil having a thickness of 25 μm, and cured at 90° C. while clamping the foil with a metal frame. Twenty four hours later, the foil was removed from the metal frame. The polycondensate coating (resin thickness was 20 μm) on the 35 mm×35 mm copper foil was post-cured by leaving the rotated foil at 90° C. for 30 minutes, at 150° C. for 30 minutes or at 230° C. for 30 minutes, and the degree of warping of the copper foil/polycondensate films was measured. Each of them was placed on a flat plane, and the maximum distance from the plane was measured. The measured distance of any of them was not more than 1.0 mm.

Example 8

A polycondensate solution was prepared as in Example 6. (Production of Polycondensate Solution)

To the flask 14.89 g (60 mmol) of BCD, 6.49 g (30 mmol) of HO-AB, 0.9 g (9 mmol) of γ-valerolactone, 1.2 g (15 mmol) of pyridine, 78 g of N-methylpyrrolidine and 20 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 8.83 g (30 mmol) of BPDA, 12.98 g (30 mmol) of bis-{4-(3-aminophenoxy)phenyl}sulfone, 6.01 g (30 mmol) of 4,4-diaminodiphenyl ether, 100 g of NMP and 20 g of toluene were added, followed by stirring the mixture at room temperature for 1 hour. The resulting mixture was heated at 180° C. under stirring at 180 μm for 3 hours and the refluxed solution was removed. After the reaction, 100 g of NMP was added. The polycondensate was in the form of a solution with a resin concentration of 15%.

The molecular weights based on polystyrene of the thus produced polycondensate solution were: Most Frequent Molecular Weight (M): 54,700, Number Average Molecular Weight (Mn): 29,700; Weight Average Molecular Weight (Mw): 62,700; Z Average Molecular Weight (Mz): 111,700.

Infrared absorption spectrum (reflected light) of the coated polycondensate resin was measured using an infrared spectrophotometer SPECTRAONE commercially available from Perkin-Elmer. It shows absorptions at 1774 cm$^{-1}$ (imide bond), 1704 cm$^{-1}$ (C=O bond) and 1658 cm$^{-1}$ (C=N bond) (FIG. 4). From this, it can be seen that the molar ratio of the imide component to the benzoxazole component in the polycondensate is 0.86:0.14. The sample was further heated at 350° C. for 1 hour in a furnace. The infrared absorption spectrum of this sample was measured. As a result, although it showed absorptions at 1774 cm$^{-1}$ (imide bond) and 1703 cm$^{-1}$ (C=O bond), the absorption at 1658 cm$^{-1}$ (C=N bond) disappeared.

The DSC of this polycondensate was measured. The Tg is 230° C.

The linear coefficient of expansion was also measured (TMA). The results are shown in Table 4 below. The polycondensate elongates in the temperature range between 0° C. and 30° C. and shrinks in the temperature range between 70° C. and 80° C. It elongates in the temperature range between 80° C. and 180° C. and shrinks again in the temperature range from 180° C. to 240° C. It elongates at temperatures of not lower than 240° C.

TABLE 4

| Measurement Temperature (° C.) | Coefficient of Expantion*1) | Coefficient of Linear Expansion*2) |
| --- | --- | --- |
| 30 | 0.61 | 2.02 |
| 80 | -2.29 | -2.86 |
| 180 | 1.89 | 1.05 |
| 210 | 1.49 | 0.74 |
| 230 | 1.90 | 0.90 |
| 240 | 0.60 | 0.25 |
| 250 | 2.79 | 1.11 |

*1): ×10$^{-3}$
*2): ×10$^{-5}$/K (warping Test of Polycondensate)

The polycondensate was coated on a copper foil having a thickness of 25 μm, and cured at 90° C. while clamping the foil with a metal frame. Twenty four hours later, the foil was removed from the metal frame. The polycondensate coating (resin thickness was 20 μm) on the 35 mm×35 mm copper foil was post-cured by leaving the coated foil at 90° C. for 30 minutes, at 150° C. for 30 minutes or at 230° C. for 30 minuets, and the degree of warping of the copper foil/polycondensate films was measured. Each of them was placed on a flat plane, and the maximum distance from the plane was measured. The measured distance of any of them was not more than 1.0 mm.

Example 9

A polycondensate solution was prepared as in Example 6. (Production of Polycondensate Solution)

To the flask. 9.67 g (30 mmol) of 3,4,3',4'-benzophenonetetracarboxylic dianhydride, 12.01 g (60 mmol) of 3,4'-diaminodiphenyl ether, 0.9 g (9 mmol) of γ-valerolactone, 1.4 g (18 mmol) of pyridine, 150 g of N-methylpyrrolidone and 30 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 24.68 g (90 mmol) of BPDA, 6.49 g (30 mmol) of HO-AB, 12.98 g (30 mmol) of bis-{4-(3-aminophenoxy)phenyl}sulfone, 209 g of NMP and 30 g of toluene were added, followed by stirring the mixture at room temperature for 1 hour. The resulting mixture was heated at 180° C. under stirring at 180 rpm for 1 hour and 30 minutes and then at 150 rpm for 1 hour, the refluxed solution was removed. After the reaction, 100 g of NMP was added. The polycondensate was in the form of a solution with a resin concentration of 15%.

The molecular weights based on polystyrene of the thus produced polycondensate solution were: Most Frequent Molecular Weight (M): 65,500, Number Average Molecular Weight (Mn): 30,900; Weight Average Molecular Weight (Mw): 86,300; Z Average Molecular Weight (Mz): 190,000.

The polycondensate solution was cast on a copper foil with a thickness of 18 µm and heated at 90° C. for 1 hour in an infrared drying furnace such that the final thickness of the coated resin was 20 µm.

Infrared absorption spectrum (reflected light) of the coated polycondensate resin was measured using an infrared spectrophotometer SPECTRAONE commercially available from Perkin-Elmer. It shows absorptions at 1774 $cm^{-1}$ (imide bond), 1713 $cm^{-1}$ (C=O bond) and 1660 $cm^{-1}$ (C=N bond). From this, it can be seen that the molar ratio of the imide component to the benzoxazole component in the polycondensate is 0.79:0.21. The sample was further heated at 350° C. for 1 hour in a furnace. The infrared absorption spectrum of this sample was measured. As a result, although it showed absorptions at 1774 $cm^{-1}$ (imide bond) and 1703 $cm^{-1}$ (C=O bond), the absorption at 1660 $cm^{-1}$ (C=N bond) disappeared.

(Warping Test of Polycondensate)

The polycondensate was coated on a copper foil having a thickness of 25 µm, and cured at 90° C. while clamping the foil with a metal frame. Twenty four hours later, the foil was removed from the metal frame. The polycondensate coating (resin thickness was 20 µm) on the 35 mm×35 mm copper foil was post-cured by leaving the coated foil at 90° C. for 30 minutes, at 150° C. for 30 minutes or at 230° C. for 30 minutes, and the degree of warping of the copper foil/polycondensate films was measured. Each of them was placed on a flat plane, and the maximum distance from the plane was measured. The measured distance of any of them was not more than 1.0 mm.

Comparative Example 2

A polycondensate solution was prepared as in Example 6. In place of HO-AB, 3,3'-dimethoxy-benzidine (CHO-AB) is used.

(Production of Polycondensate Solution)

To the flask, 14.89 g (60 mmol) of BCD, 7.33 g (30 mmol) of CHO-AB, 0.9 g (9 mmol) of γ-valerolactone, 1.4 g (18 mmol) of pyridine, 85 g of N-methylpyrrolidone and 20 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 8.83 g (30 mmol) of BPDA, 8.77 g (30 mmol) of bis(3-aminophenoxy)-1,3-benzene, 6.01 g (30 mmol) of 4,4'-diaminodiphenyl ether, 80 g of NMP and 30 g of toluene were added, followed by stirring the mixture at room temperature for 1 hour. The resulting mixture was heated at 180° C. under stirring at 180 rpm for 3 hours and 45 minutes and the refluxed solution was removed. After the reaction. 100 g of NMP was added. The polycondensate was in the form of a solution with a resin concentration of 20%.

The molecular weights based on polystyrene of the thus produced polycondensate solution were: Most Frequent Molecular Weight (M): 36,500, Number Average Molecular Weight (Mn): 21,900; Weight Average Molecular Weight (Mw): 41,600; Z Average Molecular Weight (Mz): 74,600.

The polycondensate solution was cast on a copper foil with a thickness of 18 µm and heated at 90° C. for 1 hour in an infrared drying furnace such that the final thickness of the coated resin was 20 µm.

Infrared absorption spectrum (reflected light) of the coated polycondensate resin was measured using an infrared spectrophotometer SPECTRAONE commercially available from Perkin-Elmer. It shows absorptions at 1775 $cm^{-1}$ (imide bond), 1704 $cm^{-1}$ (C=O bond) and 1586 $cm^{-1}$, but did not show an absorption of C=N bond at 1965 $cm^{-1}$, so that the polycondensate was an entirely aromatic polyamide.

(Warping Test of Polycondensate)

Although the warping test was carried out as in Example 6, the warp was too large to measure.

Example 10

(Method for Forming Images by Light Irradiation)

To 20 g (resin content of 3 g) of the solution obtained by filtering the polycondensate produced in Example 1 through a filter having a pore size of 1 µm, 0.6 g of an ester of 1,2-naphthoquinone-2-diazide-5-sulfonic acid with 2,3,4-trihydroxybenzophenone (hereinafter referred to as "NT-200"), which is a photoacid generator, was added in a dark room to prepare a uniform solution. This uniform solution was applied on the surface of a surface-treated copper foil having a diameter of 5 cm and a thickness of 18 µm (commercial product of Mitsui Metal and Mining Co., Ltd.) by spin-coating method, and dried in an infrared dryer at 90° C. for 10 minutes (prebaking). The thickness of the resin film was about 10 µm. On this coating film, a test pattern (through holes and line-and-space pattern having diameters and widths of 10, 15, 20, 25, - - - , and 200 µm, respectively) for positive-type photomask was placed, and the coating film was irradiated at a dose of exposure at which images are obtained using 2 kW extra-high pressure mercury lamp apparatus (JP-200G, commercial product of Oak Seisakusho).

After irradiating the coating film at a dose of exposure of 1000 mJ/$cm^2$, the coating film was immersed in a mixture of 40 g of NMP, 40 g of aminoethanol and 40 g of water at 35° C. for 2 minutes and 30 seconds. After washing the coating film with deionized water, the coating film was dried at 90° C. for 30 minutes and then at 200° C. for 30 minutes in an infrared dryer, followed by observation of the resolution. The thickness of the coating film was about 8 µm. As for the through hole patterns in the coating film, formation of through holes having sharp and circular sections having a diameter of 15 µm was confirmed. As for the line-and-space pattern, formation of sharp positive-type images of lines having a width of 15 µm was confirmed.

Example 11

The operations as in Example 10 were carried out.

To 15 g of the polycondensate solution (resin concentration of 20%) prepared in Example 6, 0.6 g of NT-200 was added and dissolved in a dark room.

This solution was applied on the surface of a surface-treated copper foil having a thickness of 18 µm by spin-coating method, and dried in an infrared dryer at 90° C. for 10 minutes (prebaking). The thickness of the resin film was about 10 µm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 1000 mJ/$cm^2$, the coating film was immersed in a mixture of 40 g of NMP, 40 g of aminoethanol and 40 g of water at 37° C. for 7 minutes. After washing the coating film with deionized water, the coating film was dried at 90° C. for 30 minutes and then at 200° C. for 30 minutes in an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed.

Example 12

The operations as in Example 10 were carried out.

To 20 g of the polycondensate solution (resin concentration of 15%) prepared in Example 7, 0.6 g of NT-200 was added and dissolved in a dark room.

This solution was applied on the surface of a surface-treated copper foil having a thickness of 18 μm by spin-coating method, and dried in an infrared dryer at 90° C. for 10 minutes (prebaking). The thickness of the resin film was about 10 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 1000 mJ/cm$^2$, the coating film was immersed in a mixture of 40 g of NMP, 40 g of aminoethanol and 40 g of water at 40° C. for 8 minutes and 35 seconds. After washing the coating film with deionized water, the coating film was dried at 90° C. for 30 minutes and then at 200° C. for 30 minutes in, an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed.

Example 13

The operations as in Example 10 were carried out.

To 20 g of the polycondensate solution (resin concentration of 15%) prepared in Example 8, 0.6 g of NT-200 was added and dissolved in a dark room.

This solution was applied on the surface of a surface-treated copper foil having a thickness of 18 μm by spin-coating method, and dried in an infrared dryer at 90° C. for 10 minutes (prebaking). The thickness of the resin film was about 10 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 1000 mJ/cm$^2$, the coating film was immersed in a mixture of 40 g of NMP, 40 g of aminoethanol and 40 g of water at 37° C. for 5 minutes and 54 seconds. After washing the coating film with deionized water, the coating film was dried at 90° C. for 30 minutes and then at 200° C. for 30 minutes in an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed. Example 14

(Change in Molecular Weight by Light Irradiation after Addition of Photoacid Generator)
1) Synthesis Experiment: As in Example 6

To the flask, 29.78 g (120 mmol) of BCD, 12.97 g (60 mmol) of HO-AB, 2.4 g (24 mmol) of γ-valerolactone, 3.8 g (48 mmol) of pyridine, 239 g of N-methylpyrrolidone and 40 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 35.31 g (120 mmol) of BPDA, 25.95 g (60 mmol) of bis(4-aminophenoxy)phenyl}sulfone, 24.02 g (120 mmol) of 4,4'-diamino-diphenyl ether, 234 g of butyrolactone and 40 g of toluene were added, followed by stirring the mixture at room temperature for 1 hour. The resulting mixture was heated at 180° C. under stirring at 180 rpm for 90 minutes and the refluxed solution was removed. The mixture was then heated at 180° C. for 120 minutes at 100 rpm. The polycondensate after the reaction was in the form of a solution with a resin concentration of 20%.
2) Experiments of Film Formation and Exposure To 50 g of the obtained polycondensate solution (resin concentration of 20%), 2 g of NT-200 was added and dissolved in a dark room.

The polycondensate solution was applied on the surface of a surface-treated copper foil having a thickness of 18 μm by spin-coating method, and dried in an infrared dryer at 90° C. for 10 minutes (prebaking). The thickness of the resin film was about 20 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 2000 mJ/cm$^2$, the coating film was dissolved in dimethylformamide and the molecular weight thereof was measured (Table 5).

A) the film prebaked at 90° C. for 20 minutes

B) the film irradiated with light at a dose of 2000 mJ/cm$^2$

C) the film which formed images after development with a developer (NMP:ethanolamine:water=1:1:1)

D) the film heated at 90° C. for 2 hours, 120° C. for 2 hours and 200° C. for 2 hours after the irradiation.

TABLE 5

| Molecular | Treatment Condition of Film | | | |
| --- | --- | --- | --- | --- |
| Weight | A) | B) | C) | D) |
| M | 62,300 | 63,200 | 62,000 | 53,100 |
| Mn | 32,100 | 33,700 | 31,800 | 32,200 |
| Mw | 68,300 | 70,600 | 67,400 | 101,300 |
| Mz | 119,300 | 123,700 | 117,100 | 302,700 |
| Mw/Mn | 2.13 | 2.09 | 2.12 | 3.15 |
| Mz/Mn | 3.72 | 3.67 | 3.68 | 9.41 |

As can be seen from these results, the molecular weight of the polycondensate film does not substantially change. The results show that a part of the polycondensate cross-links to increase the molecular weight by the heat treatment at 90° C., 120° C. and 200° C. after the irradiation and development.
3) Molecular Weight of Dissolved Film in Developer The molecular weight of the portion of polycondensate dissolved in the developer in the above-described experiments was measured. Although Mw was 26,600, three peaks were observed. The molecular weight of each peak was measured (Table 6).

TABLE 6

| Polycondensate Dissolved in Developer | | Peak 1 | Peak 2 | Peak 3 |
|---|---|---|---|---|
| M | 41,700 | 44,300 | 6,500 | 2,900 |
| Mn | 7,500 | 66,900 | 6,200 | 2,900 |
| Mw | 68,300 | 77,000 | 6,700 | 2,900 |
| Mz | 67,100 | 92,000 | 7,300 | 2,900 |
| Mw/Mn | 3.54 | 1.15 | 1.01 | 1.00 |
| Mz/Mn | 8.93 | 1.39 | 1.18 | 1.00 |

The molecular weight is the largest in peak 1, second largest in peak 2 and smallest in peak 3. The results shows that the polycondensate dissolved in the developer had a weight average molecular weight (Mw) of not more than 30,000, and most of them was decomposed to a molecular weight of about 3000 and dissolved in the developer.

4) Decomposition Test by Developer

After irradiating the polycondensate film having a thickness of 20 μm containing 20% of the photoacid generator with light at a dose of 2000 mJ/cm², the film was dissolved in DMF and its molecular weight was measured. Then two drops of aminoethanol were added to the resulting solution and the molecular weight thereof was measured three days later (Table 7).

TABLE 7

| Molecular Weight | Dissolved in DMF after Light Irradiation | Aminoethanol Added |
|---|---|---|
| M | 83,100 | 2,860 |
| Mn | 49,000 | 3,230 |
| Mw | 101,800 | 3,510 |
| Mz | 185,700 | 4,200 |
| Mw/Mn | 2.08 | 1.09 |
| Mz/Mn | 3.79 | 1.30 |

The polycondensate film irradiated with light is decomposed by aminoethanol and its weight average molecular weight is decreased from 101,800 to 3,500. Thus, it is thought that polyamic acid is generated and decomposed by aminoethanol in the developer so as to be dissolved therein.

Comparative Example 3
(Sensitization Experiment of Polyimide)

Synthesis Experiment was carried out as in Example 6.

To the flask, 29.78 g (120 mmol) of BCD, 14.66 g (60 mmol) of CHO-AB, 1.8 g (18 mmol) of γ-valerolactone, 2.9 g (36 mmol) of pyridine, 200 g of N-methylpyrrolidone and 30 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 17.65 g (60 mmol) of BPDA, 25.95 g (60 mmol) of bis{4-(3-aminophenoxy)phenyl}sulfone, 24.63 g (60 mmol) of 2,2-bis(4-aminophenoxyphenyl)propane, 119 g of butyrolactone and 40 g of toluene were added, followed by stirring the mixture at room temperature for 1 hour. The resulting mixture was heated at 180° C. under stirring at 180 rpm for 4 hours and 30 minutes and the refluxed solution was removed. The polycondensate after the reaction was in the form of a solution with a resin concentration of 25%.

The molecular weights based on polystyrene of the thus produced polycondensate solution were: Most Frequent Molecular Weight (M): 37,700, Number Average Molecular Weight (Mn): 23,100; Weight Average Molecular Weight (Mw): 45,000; Z Average Molecular Weight (Mz): 83,500.

To the thus obtained polycondensate solution, NT-200 was added to a concentration of 15% and Michler's ketone was added to a concentration of 15%, followed by dissolving the added products in a dark room.

The polycondensate solution was applied on the surface of a surface-treated copper foil having a thickness of 18 μm by spin-coating method, and dried in an infrared dryer at 90° C. for 10 minutes (prebaking). The thickness of the resin film was about 10 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 2000 mJ/cm², the coating film was immersed in a mixture of 40 g of NMP, 40 g of aminoethanol and 40 g of water at room temperature for 19 minutes. After washing the coating film with deionized water, the coating film was dried at 90° C. for 30 minutes and then at 200° C. for 30 minutes in an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed.

The polycondensate obtained by using CHO-AB in place of HO-AB is an entirely aromatic polyimide. The development of the images formed b) light irradiation took a little longer time than in the case where HO-AB was used.

Comparative Example 4

The operations as in Comparative Example 3 were carried out.

To the flask, 19.33 g (60 mmol) of 3,4,3',4'-benzophenonetetracarboxylic dianhydride, 12.88 g (30 mmol) of bis{4-(4-aminophenoxy)phenyl}sulfone, 1.2 g (12 mmol) of γ-valerolactone, 1.9 g (24 mmol) of pyridine, 150 g of N-methylpyrrolidone and 30 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 17.65 g (60 mmol) of BPDA, 7.33 g (30 mmol) of CHO-AB, 12.01 g (60 mmol) of 4,4'-diaminodiphenyl ether, 110 g of NMP and 20 g of toluene were added, followed by stirring the mixture at room temperature for 1 hour. The resulting mixture was heated at 180° C. under stirring at 180 rpm for 2 hours and the refluxed solution was removed. The mixture was then heated at 180° C. for 1 hour at 100 rpm. The polycondensate after the reaction was in the form of a solution with a resin concentration of 20%.

The molecular weights based on polystyrene of the thus produced polycondensate solution were: Most Frequent Molecular Weight (M): 34,500, Number Average Molecular Weight (Mn): 20,000; Weight Average Molecular Weight (Mw): 42,800; Z Average Molecular Weight (Mz): 79,900.

To the thus obtained polycondensate solution, NT-200 was added to a concentration of 20% and dissolved in a dark room.

The polycondensate solution was applied on the surface of a surface-treated copper foil having a thickness of 18 μm by spin-coating method, and dried in an infrared dryer at 90° C. for 10 minutes (prebaking). The thickness of the resin film was about 10 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 1000 mJ/cm², the coating film was immersed in a mixture of 40 g of NMP, 40 g of aminoethanol and 40 g of water at room temperature for 15 minutes and 15 seconds. After washing the coating film with deionized water, the coating film was dried at 90° C. for 30 minutes and then at 200° C. for 30 minutes in an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed.

The polycondensate obtained by using CHO-AB in place of HO-AB is an entirely aromatic polyimide. The development of the images formed by light irradiation took a little longer time than in the case where HO-AB was used.

Comparative Example 5

The operations as in Comparative Example 3 were carried out.

To the flask, 22.21 g of 6FDA, 12.98 g of HFBAPP, 1.0 g of γ-valerolactone, 1.6 g of pyridine, 185 g of N-methylpyrrolidone and 30 g of toluene were added and the mixture was heated at a silicone bath temperature of 180° C. under stirring at 180 rpm for 120 minutes. During the reaction, distillate of toluene and water was removed.

The molecular weights based on polystyrene of the thus produced polycondensate solution were: Most Frequent Molecular Weight (M): 87,700, Number Average Molecular Weight (Mn): 57,800; Weight Average Molecular Weight (Mw): 108,100; Z Average Molecular Weight (Mz): 192,300.

To the thus obtained polycondensate solution, NT-200 was added to a concentration of 30% and dissolved in a dark room.

The polycondensate solution was applied on the surface of a surface-treated copper foil having a thickness of 18 μm by spin-coating method, and dried in an infrared dryer at 90° C. for 5 minutes (prebaking). The thickness of the resin film was about 10 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 1000 mJ/cm², the coating film was immersed in a mixture of 40 g of NMP, 40 g of aminoethanol and 40 g of water at room temperature for 2 minutes. After washing the coating film with deionized water, the coating film was dried at 90° C. for 30 minutes and then at 200° C. for 30 minutes in an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed.

The polycondensate obtained by using HFBAPP in place of HO-AB in Example 1 is an aromatic polyimide, and positive images are obtained similarly by light irradiation in the presence of a photoacid generator.

Comparative Example 6

The operations as in Comparative Example 3 were carried out.

To the flask, 14,84 g of BCD, 18.32 g of 3,4'-diaminodiphenyl ether, 1.2 g of γ-valerolactone, 1.9 g of pyridine, 100 g of N-methylpyrrolidone and 20 g of toluene were added and the mixture was heated at a silicone bath temperature of 180° C. under stirring at 180 rpm for 60 minutes. During the reaction, distillate of toluene and water was removed.

The mixture was stirred at room temperature for 30 minutes at 180 rpm, and then 19.33 g of 3,4,3',4'-benzophenonetetracarboxylic dianhydride, 12.98 g of bis{4-(3-aminophenoxy)phenyl}sulfone, 124 g of NMP and 20 g of toluene were added, followed by stirring the mixture at room temperature for 2 hours and 30 minutes.

The molecular weights based on polystyrene of the thus produced polycondensate solution were: Most Frequent Molecular Weight (M): 110,000, Number Average Molecular Weight (Mn): 28,300; Weight Average Molecular Weight (Mw): 131,000; Z Average Molecular Weight (Mz): 406,700.

To the thus obtained polycondensate solution, NT-200 was added to a concentration of 10% and dissolved in a dark room.

The polycondensate solution was applied on the surface of a surface-treated copper foil having a thickness of 18 μm by spin-coating method, and dried in an infrared dryer at 90° C. for 10 minutes (prebaking). The thickness of the resin film was about 10 μm. On this coating film, a test pattern for positive-type photomask was placed, and the coating film was irradiated at a dose of exposure at which images are obtained using 2 kW extra-high pressure mercury lamp apparatus.

After irradiating the coating film at a dose of exposure of 1000 mJ/cm², the coating film was immersed in a mixture of 40 g of NMP, 40 g of aminoethanol and g of water at room temperature for 9 minutes and 45 seconds. After washing the coating film with deionized water, the coating film was dried at 90° C. for 30 minutes and then at 200° C. for 30 minutes in an infrared dryer, followed by observation of the resolution. The thickness of the coating film was about 8 μm. As for the through hole patterns in the coating film, formation of through holes having sharp and circular sections having a diameter of 15 μm was confirmed. As for the line-and-space pattern, formation of sharp positive-type images of lines having a width of 15 μm was confirmed.

The polycondensate obtained by using (BCD+3,4'-diaminodiphenyl ether) in place of (BCD+HO–AB) gives positive-type images by irradiation with light.

What is claimed is:

1. A process for producing a solvent-soluble polycondensate comprising a polyimide-benzoxazole polymer containing a benzoxazole component having a carboxylic group and an imide component having a phenolic hydroxyl group, which process comprises heating one or more tetracarboxylic dianhydrides and one or more aromatic diamines having an amine group and a phenolic hydroxyl group at a temperature of 150° C. to 220° C. in the presence of an acid catalyst, said amino group and said phenolic hydroxyl group in said aromatic diamine being located at ortho positions with respect to each other, so as to dehydration-condense said one or more tetracarboxylic dianhydrides and said one or more aromatic diamines.

2. The process according to claim 1, wherein said dehydration condensation reaction is carried out in an organic polar solvent.

3. The process according to claim 1, wherein said diamine is at least one selected from the group consisting of 1-hydroxy-2,4-diaminobenzene, 1-hydroxy-2,5-diaminobenzene, 3,3'-dihydroxybenzidine, 3,3'-dihydroxy-4,4'-diaminodiphenyl ether, 1,4-bis(3-hydroxy-4-aminophenoxy)benzene, 2,2-bis(4-amino-3-hydroxyphenyl)propane, bis(3-amino-4-hydroxyphenyl)propane, bis(3-amino-4-hydroxyphenyl)sulfide, and 2,2-bis(3-amino-4-hydroxyphenyl)hexafluoropropane.

4. The process according claim 1, wherein said tetracarboxylic dianhydride is at least one selected from the group consisting of 3,4,3',4'-biphenyltetracarboxylic dianhydride, 2,3,3',4'-biphenyltetracarboxylic dianhydride, 3,4,3',4'-benzophenonetetracarboxylic dianhydride, bicyclo(2,2,2)-oct-7-ene-2,3,5,6-tetracarboxylic dianhydride, 2,2-bis(3,4-dicarboxyphenyl)propane dianhydride, bis(3,4-dicarboxyphenyl)sulfone dianhydride, bis(3,4-dicarboxyphenyl)ether dianhydride and 2,2-bis(3,4-dicarboxyphenyl)hexafluoropropane.

5. The process according to claim 1, wherein said acid catalyst is an acid generated in situ by said dehydration condensation in the presence of a lactone-base catalyst.

6. The process according to claim 5, wherein an aromatic diamine, which does not have an amino group and phenolic hydroxyl group located at ortho positions with respect to each other, is subjected to the dehydration condensation reaction, in addition to said aromatic diamine.

7. The process according to claim 6, wherein a first tetracarboxylic dianhydride and a first aromatic diamine are first polycondensed such that one of these is in excess, and sequentially at least one of a tetracarboxylic dianhydride and aromatic amine is added so as to carry out polycondensation at a molar ratio of total tetracarboxylic dianhydride to total aromatic diamine of 0.95 to 1.05.

8. The process according to claim 6, wherein said aromatic diamine for imidation is at least one selected from the group consisting of 4,4'- or 3,4'-diaminodiphenyl ether, 4,4'-diaminodiphenylsulfone, bis{4(3-phenoxyphenyl)-diphenyl)sulfone, bis{4(4-phenoxyphenyl)-diphenyl}sulfone, 1,4-bis(3-aminophenoxy)benzene, 1,4-bis(4-aminophenoxy)benzene, 1,3-bis(3-aminophenoxy)benzene, 3,3'-aminobenzophenone, 4,4'-diaminodiphenylsulfide, 3,3'-bis{(4-aminophenoxy)-phenyl}propane, 2,2'-bis(4-aminophenoxy)phenyl)hexafluoropropane, 3,3'-dimethylbenzidine, 3,3'-dimethoxybenzidine, 1,4-diaminobenzene, 1,3-diaminobenzene, 1,3-diaminotoluene, 1,3-bis(γ-aminopropyl)siloxane and diaminosiloxane.

9. A solvent-soluble polycondensate comprising a benzoxazole component having a carboxylic group and an imide component having a phenolic hydroxyl group, which was produced by the process according to claim 1.

10. The polycondensate according to claim 9, which is shrinkable at a temperature of 30° C. to 100° C.

11. A composite copper substrate obtained by coating a copper foil with said polycondensate according to claim 9 and heating the coated copper foil at a temperature within the range of 150° C. to 250° C.

12. A method for forming a positive-type image comprising coating a substrate with a photosensitive polycondensate composition containing said polycondensate according to claim 9 and a photoacid generator; irradiating said composition with a light through a mask pattern; and developing the resulting composition with an alkaline developer.

13. The method according to claim 12, wherein said alkaline developer contains amino alcohol.

14. The method according to claim 12, wherein said substrate is copper foil.

15. A circuit board produced by the method according to claim 14.

16. A method for forming a polyimide comprising heating said polycondensate according to claim 9 at a temperature within the range of 300° C. to 350° C.

17. The process according to claim 1, wherein said temperature ranges from 170° C. to 200° C.

* * * * *